(12) United States Patent
Lynch et al.

(10) Patent No.: US 9,336,784 B2
(45) Date of Patent: May 10, 2016

(54) APPARATUS, SYSTEM AND METHOD FOR MERGING CODE LAYERS FOR AUDIO ENCODING AND DECODING AND ERROR CORRECTION THEREOF

(71) Applicant: The Nielsen Company (US), LLC, Schaumburg, IL (US)

(72) Inventors: Wendell Lynch, East Lansing, MI (US); John Stavropoulos, Edison, NJ (US); David Gish, Riverdale, NJ (US); Alan Neuhauser, Silver Spring, MD (US)

(73) Assignee: The Nielsen Company (US), LLC, New York, NY (US)

( * ) Notice: Subject to any disclaimer, the term of this patent is extended or adjusted under 35 U.S.C. 154(b) by 0 days.

(21) Appl. No.: 14/685,984

(22) Filed: Apr. 14, 2015

(65) Prior Publication Data

US 2015/0221312 A1    Aug. 6, 2015

Related U.S. Application Data

(63) Continuation of application No. 14/023,226, filed on Sep. 10, 2013, now Pat. No. 9,015,563, which is a continuation of application No. 13/955,438, filed on Jul. 31, 2013.

(51) Int. Cl.
| | | |
|---|---|---|
| *G10L 19/005* | (2013.01) |
| *G10L 19/02* | (2013.01) |
| *G10L 19/00* | (2013.01) |
| *H03M 13/05* | (2006.01) |
| *G10L 19/018* | (2013.01) |

(Continued)

(52) U.S. Cl.
CPC ............... *G10L 19/005* (2013.01); *G10L 19/00* (2013.01); *G10L 19/018* (2013.01); *G10L 19/02* (2013.01); *H03M 13/05* (2013.01); *H03M 13/09* (2013.01); *H03M 13/1515* (2013.01)

(58) Field of Classification Search
CPC ........................................................ H04L 7/048
USPC .......................................... 714/778, 755, 733
See application file for complete search history.

(56) References Cited

U.S. PATENT DOCUMENTS

| 4,230,990 A | 10/1980 | Lert, Jr. et al. |
| 4,647,974 A | 3/1987 | Butler et al. |

(Continued)

FOREIGN PATENT DOCUMENTS

| AU | 9298201 | 4/2002 |
| BR | 0112901 | 6/2003 |

(Continued)

OTHER PUBLICATIONS

Arbitron, "Critical Band Encoding Technology Audio Encoding System From Arbitron," Feb. 2008, 27 pages.

(Continued)

*Primary Examiner* — Fritz Alphonse
(74) *Attorney, Agent, or Firm* — Hanley, Flight & Zimmerman, LLC

(57) ABSTRACT

Apparatus, system and method for encoding and decoding ancillary code for digital audio, where multiple encoding layers are merged. The merging allows a greater number of ancillary codes to be embedded into the encoding space, and further introduces efficiencies in the encoding process. Utilizing certain error correction techniques, the decoding of ancillary code may be improved and made more reliable.

24 Claims, 13 Drawing Sheets

(51) Int. Cl.
*H03M 13/09* (2006.01)
*H03M 13/15* (2006.01)

(56) References Cited

U.S. PATENT DOCUMENTS

| | | |
|---|---|---|
| 4,677,466 A | 6/1987 | Lert, Jr. et al. |
| 4,697,209 A | 9/1987 | Kiewit et al. |
| 4,745,468 A | 5/1988 | Von Kohorn |
| 4,876,592 A | 10/1989 | Von Kohorn |
| 4,876,736 A | 10/1989 | Kiewit |
| 4,926,255 A | 5/1990 | Von Kohorn |
| 4,973,952 A | 11/1990 | Malec et al. |
| 5,019,899 A | 5/1991 | Boles et al. |
| 5,023,929 A | 6/1991 | Call |
| 5,034,807 A | 7/1991 | Von Kohorn |
| 5,057,915 A | 10/1991 | Von Kohorn |
| 5,081,680 A | 1/1992 | Bennett |
| 5,128,752 A | 7/1992 | Von Kohorn |
| 5,157,489 A | 10/1992 | Lowe |
| 5,227,874 A | 7/1993 | Von Kohorn |
| 5,245,665 A | 9/1993 | Lewis et al. |
| 5,249,044 A | 9/1993 | Von Kohorn |
| 5,283,734 A | 2/1994 | Von Kohorn |
| 5,331,544 A | 7/1994 | Lu et al. |
| 5,401,946 A | 3/1995 | Weinblatt |
| 5,425,100 A | 6/1995 | Thomas et al. |
| 5,450,490 A | 9/1995 | Jensen et al. |
| 5,481,294 A | 1/1996 | Thomas et al. |
| 5,512,933 A | 4/1996 | Wheatley et al. |
| 5,524,195 A | 6/1996 | Clanton, III et al. |
| 5,543,856 A | 8/1996 | Rosser et al. |
| 5,574,962 A | 11/1996 | Fardeau et al. |
| 5,579,124 A | 11/1996 | Aijala et al. |
| 5,581,800 A | 12/1996 | Fardeau et al. |
| 5,594,934 A | 1/1997 | Lu et al. |
| 5,629,739 A | 5/1997 | Dougherty |
| 5,659,366 A | 8/1997 | Kerman |
| 5,666,293 A | 9/1997 | Metz et al. |
| 5,682,196 A | 10/1997 | Freeman |
| 5,719,634 A | 2/1998 | Keery et al. |
| 5,719,880 A * | 2/1998 | Leung .................. 714/733 |
| 5,734,413 A | 3/1998 | Lappington et al. |
| 5,740,035 A | 4/1998 | Cohen et al. |
| 5,764,763 A | 6/1998 | Jensen et al. |
| 5,787,334 A | 7/1998 | Fardeau et al. |
| 5,815,671 A | 9/1998 | Morrison |
| 5,841,978 A | 11/1998 | Rhoads |
| 5,848,155 A | 12/1998 | Cox |
| 5,850,249 A | 12/1998 | Massetti et al. |
| 5,872,588 A | 2/1999 | Aras et al. |
| 5,880,789 A | 3/1999 | Inaba |
| 5,893,067 A | 4/1999 | Bender et al. |
| 5,918,223 A | 6/1999 | Blum et al. |
| 5,930,369 A | 7/1999 | Cox et al. |
| 5,933,789 A | 8/1999 | Byun et al. |
| 5,956,716 A | 9/1999 | Kenner et al. |
| 5,956,743 A * | 9/1999 | Bruce et al. .................. 711/103 |
| 5,966,120 A | 10/1999 | Arazi et al. |
| 5,974,396 A | 10/1999 | Anderson et al. |
| 5,987,855 A | 11/1999 | Dey et al. |
| 6,034,722 A | 3/2000 | Viney et al. |
| 6,035,177 A | 3/2000 | Moses et al. |
| 6,049,830 A | 4/2000 | Saib |
| 6,055,573 A | 4/2000 | Gardenswartz et al. |
| 6,154,209 A | 11/2000 | Naughton et al. |
| 6,208,735 B1 | 3/2001 | Cox et al. |
| 6,216,129 B1 | 4/2001 | Eldering |
| 6,286,036 B1 | 9/2001 | Rhoads |
| 6,286,140 B1 | 9/2001 | Ivanyi |
| 6,298,348 B1 | 10/2001 | Eldering |
| 6,308,327 B1 | 10/2001 | Liu et al. |
| 6,331,876 B1 | 12/2001 | Koster et al. |
| 6,335,736 B1 | 1/2002 | Wagner et al. |
| 6,363,159 B1 | 3/2002 | Rhoads |
| 6,389,055 B1 | 5/2002 | August et al. |
| 6,400,827 B1 | 6/2002 | Rhoads |
| 6,411,725 B1 | 6/2002 | Rhoads |
| 6,421,445 B1 | 7/2002 | Jensen et al. |
| 6,487,564 B1 | 11/2002 | Asai et al. |
| 6,505,160 B1 | 1/2003 | Levy et al. |
| 6,512,836 B1 | 1/2003 | Xie et al. |
| 6,513,014 B1 | 1/2003 | Walker et al. |
| 6,522,771 B2 | 2/2003 | Rhoads |
| 6,539,095 B1 | 3/2003 | Rhoads |
| 6,546,556 B1 | 4/2003 | Kataoka et al. |
| 6,553,178 B2 | 4/2003 | Abecassis |
| 6,642,966 B1 | 11/2003 | Limaye |
| 6,647,269 B2 | 11/2003 | Hendrey et al. |
| 6,651,253 B2 | 11/2003 | Dudkiewicz et al. |
| 6,654,480 B2 | 11/2003 | Rhoads |
| 6,665,873 B1 | 12/2003 | Van Gestel et al. |
| 6,675,383 B1 | 1/2004 | Wheeler et al. |
| 6,683,966 B1 | 1/2004 | Tian et al. |
| 6,687,663 B1 | 2/2004 | McGrath et al. |
| 6,710,815 B1 | 3/2004 | Billmaier et al. |
| 6,714,683 B1 | 3/2004 | Tian et al. |
| 6,741,684 B2 | 5/2004 | Kaars |
| 6,748,362 B1 | 6/2004 | Meyer et al. |
| 6,750,985 B2 | 6/2004 | Rhoads |
| 6,766,523 B2 | 7/2004 | Herley |
| 6,795,972 B2 | 9/2004 | Rovira |
| 6,804,379 B2 | 10/2004 | Rhoads |
| 6,829,368 B2 | 12/2004 | Meyer et al. |
| 6,845,360 B2 | 1/2005 | Jensen et al. |
| 6,853,634 B1 | 2/2005 | Davies et al. |
| 6,871,180 B1 | 3/2005 | Neuhauser et al. |
| 6,871,323 B2 | 3/2005 | Wagner et al. |
| 6,873,688 B1 | 3/2005 | Aarnio |
| 6,941,275 B1 | 9/2005 | Swierczek |
| 6,956,575 B2 | 10/2005 | Nakazawa et al. |
| 6,965,601 B1 | 11/2005 | Nakano et al. |
| 6,968,315 B1 | 11/2005 | Nakisa |
| 6,968,564 B1 | 11/2005 | Srinivasan |
| 6,970,886 B1 | 11/2005 | Conwell et al. |
| 6,996,213 B1 | 2/2006 | De Jong |
| 7,003,731 B1 | 2/2006 | Rhoads et al. |
| 7,006,555 B1 | 2/2006 | Srinivasan |
| 7,050,603 B2 | 5/2006 | Rhoads et al. |
| 7,051,086 B2 | 5/2006 | Rhoads et al. |
| 7,058,697 B2 | 6/2006 | Rhoads |
| 7,082,434 B2 | 7/2006 | Gosselin |
| 7,095,871 B2 | 8/2006 | Jones et al. |
| 7,143,949 B1 | 12/2006 | Hannigan |
| 7,158,943 B2 | 1/2007 | Van der Riet |
| 7,171,018 B2 | 1/2007 | Rhoads et al. |
| 7,174,293 B2 | 2/2007 | Kenyon et al. |
| 7,185,201 B2 | 2/2007 | Rhoads et al. |
| 7,194,752 B1 | 3/2007 | Kenyon et al. |
| 7,197,156 B1 | 3/2007 | Levy |
| 7,215,280 B1 | 5/2007 | Percy et al. |
| 7,221,405 B2 | 5/2007 | Basson et al. |
| 7,227,972 B2 | 6/2007 | Brundage et al. |
| 7,254,249 B2 | 8/2007 | Rhoads et al. |
| 7,269,564 B1 | 9/2007 | Milsted et al. |
| 7,273,978 B2 | 9/2007 | Uhle |
| 7,317,716 B1 | 1/2008 | Boni et al. |
| 7,328,153 B2 | 2/2008 | Wells et al. |
| 7,346,512 B2 | 3/2008 | Li-Chun Wang et al. |
| 7,356,700 B2 | 4/2008 | Noridomi et al. |
| 7,363,278 B2 | 4/2008 | Schmelzer et al. |
| 7,369,678 B2 | 5/2008 | Rhoads |
| 7,421,723 B2 | 9/2008 | Harkness et al. |
| 7,440,674 B2 | 10/2008 | Plotnick et al. |
| 7,443,292 B2 | 10/2008 | Jensen et al. |
| 7,463,143 B2 | 12/2008 | Forr et al. |
| 7,519,658 B1 | 4/2009 | Anglin et al. |
| 7,592,908 B2 | 9/2009 | Zhang et al. |
| 7,623,823 B2 | 11/2009 | Zito et al. |
| 7,640,141 B2 | 12/2009 | Kolessar et al. |
| 7,761,602 B1 | 7/2010 | Knight et al. |
| RE42,627 E | 8/2011 | Neuhauser et al. |
| 8,229,159 B2 | 7/2012 | Tourapis et al. |
| 8,255,763 B1 | 8/2012 | Yang et al. |
| 8,369,972 B2 | 2/2013 | Topchy et al. |

(56) References Cited

U.S. PATENT DOCUMENTS

| | | |
|---|---|---|
| 8,768,713 B2 | 7/2014 | Chaoui et al. |
| 8,924,995 B2 | 12/2014 | Ramaswamy et al. |
| 9,015,563 B2 | 4/2015 | Lynch et al. |
| 2001/0044899 A1 | 11/2001 | Levy |
| 2001/0056573 A1 | 12/2001 | Kovac et al. |
| 2002/0032734 A1 | 3/2002 | Rhoads |
| 2002/0033842 A1 | 3/2002 | Zetts |
| 2002/0053078 A1 | 5/2002 | Holtz et al. |
| 2002/0056094 A1 | 5/2002 | Dureau |
| 2002/0059218 A1 | 5/2002 | August et al. |
| 2002/0062382 A1 | 5/2002 | Rhoads et al. |
| 2002/0091991 A1 | 7/2002 | Castro |
| 2002/0102993 A1 | 8/2002 | Hendrey et al. |
| 2002/0108125 A1 | 8/2002 | Joao |
| 2002/0111934 A1 | 8/2002 | Narayan |
| 2002/0112002 A1 | 8/2002 | Abato |
| 2002/0124246 A1 | 9/2002 | Kaminsky et al. |
| 2002/0138851 A1 | 9/2002 | Lord et al. |
| 2002/0144262 A1 | 10/2002 | Plotnick et al. |
| 2002/0144273 A1 | 10/2002 | Reto |
| 2002/0162118 A1 | 10/2002 | Levy et al. |
| 2002/0174425 A1 | 11/2002 | Markel et al. |
| 2002/0194592 A1 | 12/2002 | Tsuchida et al. |
| 2003/0021441 A1 | 1/2003 | Levy et al. |
| 2003/0039465 A1 | 2/2003 | Bjorgan et al. |
| 2003/0088674 A1 | 5/2003 | Ullman et al. |
| 2003/0105870 A1 | 6/2003 | Baum |
| 2003/0108200 A1 | 6/2003 | Sako |
| 2003/0115598 A1 | 6/2003 | Pantoja |
| 2003/0177488 A1 | 9/2003 | Smith et al. |
| 2003/0185232 A1 | 10/2003 | Moore et al. |
| 2003/0229900 A1 | 12/2003 | Reisman |
| 2004/0004630 A1 | 1/2004 | Kalva et al. |
| 2004/0006696 A1 | 1/2004 | Shin et al. |
| 2004/0024588 A1 | 2/2004 | Watson et al. |
| 2004/0031058 A1 | 2/2004 | Reisman |
| 2004/0037271 A1 | 2/2004 | Liscano et al. |
| 2004/0038692 A1 | 2/2004 | Muzaffar |
| 2004/0059918 A1 | 3/2004 | Xu |
| 2004/0059933 A1 | 3/2004 | Levy |
| 2004/0064319 A1 | 4/2004 | Neuhauser et al. |
| 2004/0073916 A1 | 4/2004 | Petrovic et al. |
| 2004/0073951 A1 | 4/2004 | Bae et al. |
| 2004/0102961 A1 | 5/2004 | Jensen et al. |
| 2004/0120417 A1 | 6/2004 | Lynch et al. |
| 2004/0125125 A1 | 7/2004 | Levy |
| 2004/0128514 A1 | 7/2004 | Rhoads |
| 2004/0137929 A1 | 7/2004 | Jones et al. |
| 2004/0143844 A1 | 7/2004 | Brant et al. |
| 2004/0146161 A1 | 7/2004 | De Jong |
| 2004/0163020 A1 | 8/2004 | Sidman |
| 2004/0184369 A1 | 9/2004 | Herre et al. |
| 2004/0199387 A1 | 10/2004 | Wang et al. |
| 2004/0267533 A1 | 12/2004 | Hannigan et al. |
| 2005/0028189 A1 | 2/2005 | Heine et al. |
| 2005/0033758 A1 | 2/2005 | Baxter |
| 2005/0036653 A1 | 2/2005 | Brundage et al. |
| 2005/0058319 A1 | 3/2005 | Rhoads et al. |
| 2005/0086682 A1 | 4/2005 | Burges et al. |
| 2005/0144004 A1 | 6/2005 | Bennett et al. |
| 2005/0192933 A1 | 9/2005 | Rhoads et al. |
| 2005/0216346 A1 | 9/2005 | Kusumoto et al. |
| 2005/0234728 A1 | 10/2005 | Tachibana et al. |
| 2005/0234731 A1 | 10/2005 | Sirivara et al. |
| 2005/0234774 A1 | 10/2005 | Dupree |
| 2005/0262351 A1 | 11/2005 | Levy |
| 2005/0271246 A1 | 12/2005 | Sharma et al. |
| 2006/0059277 A1 | 3/2006 | Zito et al. |
| 2006/0083403 A1 | 4/2006 | Zhang et al. |
| 2006/0089912 A1 | 4/2006 | Spagna et al. |
| 2006/0095401 A1 | 5/2006 | Krikorian et al. |
| 2006/0107195 A1 | 5/2006 | Ramaswamy et al. |
| 2006/0107302 A1 | 5/2006 | Zdepski |
| 2006/0110005 A1 | 5/2006 | Tapson |
| 2006/0136564 A1 | 6/2006 | Ambrose |
| 2006/0167747 A1 | 7/2006 | Goodman et al. |
| 2006/0168613 A1 | 7/2006 | Wood et al. |
| 2006/0212710 A1 | 9/2006 | Baum et al. |
| 2006/0221173 A1 | 10/2006 | Duncan |
| 2006/0224798 A1 | 10/2006 | Klein et al. |
| 2006/0280246 A1 | 12/2006 | Alattar et al. |
| 2007/0006250 A1 | 1/2007 | Croy et al. |
| 2007/0016918 A1 | 1/2007 | Alcorn et al. |
| 2007/0055987 A1 | 3/2007 | Lu et al. |
| 2007/0061577 A1 | 3/2007 | Van De Kerkhof et al. |
| 2007/0064937 A1 | 3/2007 | Van Leest et al. |
| 2007/0070429 A1 | 3/2007 | Hein et al. |
| 2007/0104335 A1 | 5/2007 | Shi et al. |
| 2007/0110089 A1 | 5/2007 | Essafi et al. |
| 2007/0118375 A1 | 5/2007 | Kenyon et al. |
| 2007/0124771 A1 | 5/2007 | Shvadron |
| 2007/0127717 A1 | 6/2007 | Herre et al. |
| 2007/0129952 A1 | 6/2007 | Kenyon et al. |
| 2007/0143778 A1 | 6/2007 | Covell et al. |
| 2007/0149114 A1 | 6/2007 | Danilenko |
| 2007/0162927 A1 | 7/2007 | Ramaswamy et al. |
| 2007/0198738 A1 | 8/2007 | Angiolillo et al. |
| 2007/0201835 A1 | 8/2007 | Rhoads |
| 2007/0226760 A1 | 9/2007 | Neuhauser et al. |
| 2007/0240234 A1 | 10/2007 | Watson |
| 2007/0242826 A1 | 10/2007 | Rassool |
| 2007/0250716 A1 | 10/2007 | Brunk et al. |
| 2007/0274523 A1 | 11/2007 | Rhoads |
| 2007/0276925 A1 | 11/2007 | La Joie et al. |
| 2007/0276926 A1 | 11/2007 | La Joie et al. |
| 2007/0288476 A1 | 12/2007 | Flanagan, III et al. |
| 2007/0294057 A1 | 12/2007 | Crystal et al. |
| 2007/0294132 A1 | 12/2007 | Zhang et al. |
| 2007/0294705 A1 | 12/2007 | Gopalakrishnan et al. |
| 2007/0294706 A1 | 12/2007 | Neuhauser et al. |
| 2008/0019560 A1 | 1/2008 | Rhoads |
| 2008/0022114 A1 | 1/2008 | Moskowitz |
| 2008/0027734 A1 | 1/2008 | Zhao et al. |
| 2008/0028223 A1 | 1/2008 | Rhoads |
| 2008/0028474 A1 | 1/2008 | Horne et al. |
| 2008/0040354 A1 | 2/2008 | Ray et al. |
| 2008/0059160 A1 | 3/2008 | Saunders et al. |
| 2008/0065507 A1 | 3/2008 | Morrison et al. |
| 2008/0077956 A1 | 3/2008 | Morrison et al. |
| 2008/0082510 A1 | 4/2008 | Wang et al. |
| 2008/0082922 A1 | 4/2008 | Biniak et al. |
| 2008/0083003 A1 | 4/2008 | Biniak et al. |
| 2008/0133223 A1 | 6/2008 | Son et al. |
| 2008/0137749 A1 | 6/2008 | Tian et al. |
| 2008/0139182 A1 | 6/2008 | Levy et al. |
| 2008/0140573 A1 | 6/2008 | Levy et al. |
| 2008/0168503 A1 | 7/2008 | Sparrell |
| 2008/0209219 A1 | 8/2008 | Rhein |
| 2008/0209491 A1 | 8/2008 | Hasek |
| 2008/0215333 A1 | 9/2008 | Tewfik et al. |
| 2008/0219496 A1 | 9/2008 | Tewfik et al. |
| 2008/0235077 A1 | 9/2008 | Harkness et al. |
| 2009/0031134 A1 | 1/2009 | Levy |
| 2009/0070408 A1 | 3/2009 | White |
| 2009/0070587 A1 | 3/2009 | Srinivasan |
| 2009/0119723 A1 | 5/2009 | Tinsman |
| 2009/0125310 A1 | 5/2009 | Lee et al. |
| 2009/0150553 A1 | 6/2009 | Collart et al. |
| 2009/0193052 A1 | 7/2009 | FitzGerald et al. |
| 2009/0259325 A1 | 10/2009 | Topchy et al. |
| 2009/0265214 A1 | 10/2009 | Jobs et al. |
| 2009/0307061 A1 | 12/2009 | Monighetti et al. |
| 2009/0307084 A1 | 12/2009 | Monighetti et al. |
| 2010/0008500 A1 | 1/2010 | Lisanke et al. |
| 2010/0135638 A1 | 6/2010 | Mio |
| 2010/0166120 A1 | 7/2010 | Baum et al. |
| 2010/0223062 A1 | 9/2010 | Srinivasan et al. |
| 2010/0268573 A1 | 10/2010 | Jain et al. |
| 2011/0224992 A1 | 9/2011 | Chaoui et al. |
| 2012/0239407 A1 | 9/2012 | Lynch et al. |
| 2013/0096706 A1 | 4/2013 | Srinivasan et al. |
| 2013/0144631 A1 | 6/2013 | Miyasaka et al. |
| 2014/0189724 A1 | 7/2014 | Harkness et al. |
| 2015/0039320 A1 | 2/2015 | Neuhauser et al. |

(56) References Cited

U.S. PATENT DOCUMENTS

| | | | |
|---|---|---|---|
| 2015/0039321 A1 | 2/2015 | Neuhauser et al. | |
| 2015/0039322 A1 | 2/2015 | Lynch et al. | |
| 2015/0039972 A1 | 2/2015 | Lynch et al. | |

FOREIGN PATENT DOCUMENTS

| | | | |
|---|---|---|---|
| CA | 0309598 | | 2/2005 |
| CN | 1149366 | | 5/1997 |
| CN | 1372682 | | 10/2002 |
| CN | 2483104 | | 11/2003 |
| CN | 1592906 | | 3/2005 |
| CN | 1647160 | | 7/2005 |
| CN | 101243688 | | 8/2008 |
| EP | 0769749 | | 4/1997 |
| EP | 1267572 | A2 | 12/2002 |
| EP | 1349370 | | 10/2003 |
| EP | 1406403 | | 4/2004 |
| EP | 1307833 | | 6/2006 |
| EP | 1703460 | A1 | 9/2006 |
| EP | 1745464 | | 10/2007 |
| EP | 1704695 | | 2/2008 |
| EP | 1504445 | | 8/2008 |
| EP | 2487858 | | 8/2012 |
| JP | 2001040322 | | 8/2002 |
| JP | 2002247610 | | 8/2002 |
| JP | 2003208187 | A | 7/2003 |
| JP | 2003536113 | A | 12/2003 |
| JP | 2006154851 | | 6/2006 |
| JP | 2007318745 | A | 12/2007 |
| WO | 9527349 | A1 | 10/1995 |
| WO | 9702672 | | 1/1997 |
| WO | 0004662 | | 1/2000 |
| WO | 0019699 | | 4/2000 |
| WO | 0119088 | | 3/2001 |
| WO | 0124027 | | 4/2001 |
| WO | 0131497 | | 5/2001 |
| WO | 0140963 | | 6/2001 |
| WO | 0153922 | | 7/2001 |
| WO | 0175743 | | 10/2001 |
| WO | 0191109 | | 11/2001 |
| WO | 0205517 | | 1/2002 |
| WO | 0211123 | | 2/2002 |
| WO | 0215081 | | 2/2002 |
| WO | 0217591 | | 2/2002 |
| WO | 0219625 | | 3/2002 |
| WO | 0227600 | | 4/2002 |
| WO | 0237381 | | 5/2002 |
| WO | 0245034 | | 6/2002 |
| WO | 0265318 | | 8/2002 |
| WO | 02061652 | | 8/2002 |
| WO | 02065305 | | 8/2002 |
| WO | 02069121 | | 9/2002 |
| WO | 03009277 | | 1/2003 |
| WO | 03091990 | | 11/2003 |
| WO | 03094499 | | 11/2003 |
| WO | 03096337 | | 11/2003 |
| WO | 2004010352 | | 1/2004 |
| WO | 2004040416 | | 5/2004 |
| WO | 2004040475 | | 5/2004 |
| WO | 2005025217 | | 3/2005 |
| WO | 2005064885 | | 7/2005 |
| WO | 2005101243 | | 10/2005 |
| WO | 2005111998 | | 11/2005 |
| WO | 2006012241 | | 2/2006 |
| WO | 2006025797 | | 3/2006 |
| WO | 2007056531 | | 5/2007 |
| WO | 2007056532 | | 5/2007 |
| WO | 2008042953 | | 4/2008 |
| WO | 2008044664 | | 4/2008 |
| WO | 2008045950 | | 4/2008 |
| WO | 2008110002 | | 9/2008 |
| WO | 2008110790 | | 9/2008 |
| WO | 2009011206 | | 1/2009 |
| WO | 2009061651 | | 5/2009 |
| WO | 2009064561 | | 5/2009 |
| WO | 2010048458 | A3 | 4/2010 |

OTHER PUBLICATIONS

United States Patent and Trademark Office, "Non-Final Office Action," issued in connection with U.S. Appl. No. 14/023,226, Jul. 31, 2014, 15 pages.

United States Patent and Trademark Office, "Notice of Allowance," issued in connection with U.S. Appl. No. 14/023,226, Dec. 23, 2014, 23 pages.

Patent Cooperation Treaty, "International Search Report and Written Opinion," issued in connection with Application No. PCT/US2014/049202, Nov. 12, 2014, 9 pages.

Fink et al., "Social- and Interactive- Television Applications Based on Real-Time Ambient-Audio Identification," EuroITV, 2006 (10 pages).

United States Patent and Trademark Office, "Non-Final Office Action," issued in connection with U.S. Appl. No. 12/464,811, Aug. 31, 2012, 46 pages.

United States Patent and Trademark Office, "Non-Final Office Action," issued in connection with U.S. Appl. No. 12/464,811, Apr. 1, 2013, 23 pages.

United States Patent and Trademark Office, "Final Office Action," issued in connection with U.S. Appl. No. 12/464,811, Dec. 17, 2013, 41 pages.

United States Patent and Trademark Office, "Non-Final Office Action," issued in connection with U.S. Appl. No. 13/955,438, May 22, 2015, 27 pages.

United States Patent and Trademark Office, "Non-Final Office Action," issued in connection with U.S. Appl. No. 14/023,221, Jun. 29, 2015, 66 pages.

United States Patent and Trademark Office, "Non-Final Office Action," issued in connection with U.S. Appl. No. 12/464,811, Jul. 6, 2015, 52 pages.

United States Patent and Trademark Office, "Non-Final Office Action," issued in connection with U.S. Appl. No. 13/955,245, Aug. 20, 2015, 26 pages.

European Patent Office, "Communication pursuant to Article 94(3) EPC", issued in connection with European Patent Application No. 09 748 892.8, mailed Dec. 21, 2015, (7 pages).

United States Patent and Trademark Office, "Final Office Action," issued in connection with U.S Appl. No. 14/023,221, mailed Dec. 3, 2015, (11 pages).

United States Patent and Trademark Office, "Final Office Action," issued in connection with U.S Appl. No. 13/955,438, mailed Dec. 4, 2015, (13 pages).

International Bureau, "International Preliminary Report on Patentability", issued in connection with PCT patent application No. PCT/US2014/049202, mailed Feb. 11, 2016 (5 pages).

United States Patent and Trademark Office, "Final Office Action", issued in connection with U.S Appl. No. 13/955,245, mailed Feb. 26, 2016 (11 pages).

United States Patent and Trademark Office, "Final Office Action," issued in connection with U.S. Appl. No. 12/464,811, Mar. 10, 2016 (14 pages).

* cited by examiner

| Message Positions for (15,9) code | | | | | | | | | | | | | | | |
|---|---|---|---|---|---|---|---|---|---|---|---|---|---|---|---|
| 1 | 2 | 3 | 4 | 5 | 6 | 7 | 8 | 9 | 10 | 11 | 12 | 13 | 14 | 15 | |
| 35 | 9 | 5 | 50 | 20 | 47 | 14 | 27 | 1 | 36 | 7 | 34 | 22 | 34 | 125 | 0 |
| 17 | 28 | 47 | 22 | 3 | 28 | 120 | 32 | 9 | 50 | 48 | 41 | 36 | 25 | 12 | 1 |
| 10 | 4 | 49 | 1 | 31 | 41 | 8 | 9 | 31 | 1 | 6 | 7 | 47 | 46 | 30 | 2 |
| 39 | 110 | 8 | 27 | 10 | 46 | 20 | 99 | 14 | 19 | 50 | 37 | 24 | 32 | 26 | 3 |
| 20 | 30 | 41 | 28 | 6 | 33 | 44 | 47 | 89 | 8 | 40 | 27 | 30 | 20 | 42 | 4 |
| 1 | 30 | 29 | 33 | 12 | 93 | 18 | 20 | 23 | 49 | 47 | 7 | 70 | 9 | 38 | 5 |
| 100 | 23 | 48 | 6 | 23 | 4 | 10 | 42 | 29 | 47 | 8 | 38 | 9 | 20 | 25 | 6 |
| 31 | 32 | 37 | 14 | 7 | 32 | 19 | 28 | 42 | 33 | 42 | 62 | 44 | 50 | 28 | 7 |
| 47 | 5 | 10 | 39 | 107 | 43 | 2 | 11 | 27 | 21 | 29 | 2 | 25 | 16 | 48 | 8 |
| 35 | 49 | 60 | 8 | 37 | 34 | 18 | 39 | 14 | 10 | 15 | 18 | 38 | 12 | 11 | 9 |
| 34 | 15 | 23 | 44 | 4 | 39 | 36 | 11 | 36 | 20 | 27 | 46 | 23 | 9 | 34 | 10 |
| 45 | 22 | 9 | 36 | 21 | 35 | 8 | 18 | 0 | 52 | 3 | 34 | 10 | 39 | 0 | 11 |
| 0 | 49 | 46 | 97 | 20 | 24 | 1 | 44 | 1 | 34 | 44 | 8 | 29 | 3 | 1 | 12 |
| 35 | 17 | 28 | 36 | 38 | 5 | 37 | 49 | 35 | 2 | 45 | 25 | 45 | 34 | 7 | 13 |
| 48 | 17 | 8 | 35 | 44 | 18 | 3 | 17 | 22 | 19 | 35 | 31 | 3 | 1 | 45 | 14 |
| 4 | 21 | 10 | 4 | 15 | 14 | 22 | 31 | 42 | 48 | 44 | 41 | 0 | 54 | 23 | 15 |

Data symbol soft metrics (0-15)

FIG. 12

APPARATUS, SYSTEM AND METHOD FOR MERGING CODE LAYERS FOR AUDIO ENCODING AND DECODING AND ERROR CORRECTION THEREOF

TECHNICAL FIELD

The present disclosure relates to audio encoding and decoding for determining characteristics of media data. More specifically, the present disclosure relates to techniques for embedding data into audio and reading the embedded data for audience measurement purposes, and for correction of errors therein.

BACKGROUND INFORMATION

There has been considerable interest in monitoring the use of mobile terminals, such as smart phones, tablets, laptops, etc. for audience measurement and/or marketing purposes. In the area of media exposure monitoring, ancillary audio codes have shown themselves to be particularly effective in assisting media measurement entities to determine and establish media exposure data. One technique for encoding and detecting ancillary audio codes is based on Critical Band Encoding Technology (CBET), pioneered by Arbitron Inc., which is currently being used in conjunction with a special-purpose Personal People Meters (PPM™) to detect codes via ambient encoded audio.

Conventional CBET encoding and decoding is based on multiple layers, where message code symbols are encoded into separate parallel encoding layers, resulting in tens of thousands of possible codes that may be used to identify and/or characterize media. While such configurations have proven to be advantageous, thousands of codes may not be sufficient to identify and/or characterize larger media collections, which may number in the millions or billions. Accordingly, techniques are needed to be able to include much larger amounts of code data within audio. Also, techniques are needed to be able to merge or "fold" encoding layers so that more efficient coding may be enabled. Furthermore, techniques for error correction are needed to ensure that merged layer are properly encoded and/or decoded.

BRIEF SUMMARY

An example method is disclosed for decoding audio data acoustically embedded with a message structure comprising a sequence of message symbols coexisting within two encoded layers along the time base of the audio data, each message symbol comprising a combination of substantially single-frequency components and a predefined symbol interval within a time base of the audio data, where the method comprises the steps of detecting the substantially single-frequency components of the message symbols; and detecting the message symbols based on the detected substantially single-frequency components thereof, wherein the detection is based at least in part on a synchronization of the message symbols between the two encoded layers. The method may further comprise the step of performing error correction on at least some of the detected message symbols, wherein the error correction comprises a Reed-Solomon error correction or a convolutional code error correction.

An example decoder is disclosed that is configured to decode audio data acoustically embedded with a message structure comprising a sequence of message symbols coexisting within two encoded layers along the time base of the audio data, each message symbol comprising a combination of substantially single-frequency components and a predefined symbol interval within a time base of the audio data. The example decoder comprises a first decoder portion for detecting the substantially single-frequency components of the message symbols, and a second decoder portion for detecting the message symbols based on the detected substantially single-frequency components thereof, wherein the detection is based at least in part on a synchronization of the message symbols between the two encoded layers. The decoder may further comprise a decoder portion configured to perform error correction on at least some of the detected message symbols, wherein the error correction comprises a Reed-Solomon error correction or a convolutional code error correction.

BRIEF DESCRIPTION OF THE DRAWINGS

Examples are illustrated in the figures of the accompanying drawings, in which like references indicate similar elements and in which:

FIGS. 8 and 8A are example message structures for arranging codes among merged layers to obtain supplemental information;

FIG. 12 is an example for performing error correction on an encoded audio signal;

DETAILED DESCRIPTION

A mobile terminal as used herein comprises at least one wireless communications transceiver. Non-limiting examples of the transceivers include a GSM (Global System for Mobile Communications) transceiver, a GPRS (General Packet Radio Service) transceiver, an EDGE (Enhanced Data rates for Global Evolution) transceiver, a UMTS (Universal Mobile Telecommunications System) transceiver, a WCDMA (wideband code division multiple access) transceiver, a PDC (Personal Digital Cellular) transceiver, a PHS (Personal Handy-phone System) transceiver, and a WLAN (Wireless LAN, wireless local area network) transceiver. The transceiver may be such that it is configured to co-operate with a predetermined communications network (infrastructure), such as the transceivers listed above. The network may further connect to other networks and provide versatile switching means for establishing circuit switched and/or packet switched connections between the two end points. Additionally, the device may include a wireless transceiver such as a Bluetooth adapter meant for peer-to-peer communication and piconet/scatternet use. Furthermore, the terminal may include interface(s) for wired connections and associated communication relative to external entities, such as an USB (Universal Serial Bus) interface or a Firewire interface.

Figure 1:
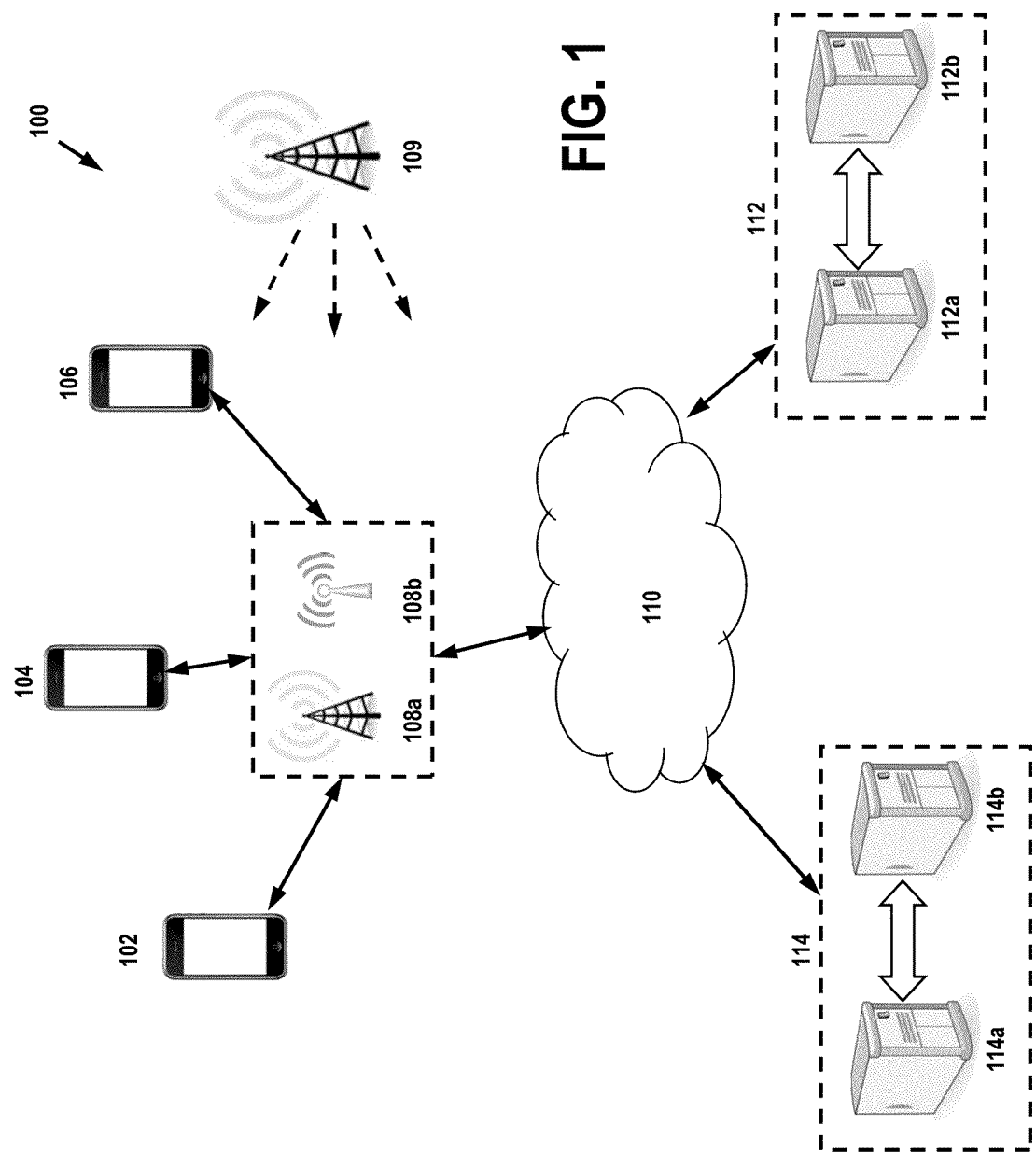
FIG. 1 is an example system diagram illustrating communication among mobile terminals to a computer network that is communicatively coupled to at least one server arrangement and external entities.

Turning to FIG. 1, an example system architecture is illustrated. The example system comprises an audio monitoring part executed in one or more terminals, or portable computing devices 102, 104, 106 of respective users and a server arrangement part 112 comprising one or more server devices (112a, 112b) functionally arranged so as to establish a media server entity. Devices 102-106 may also receive (or be in the vicinity of) broadcast media and the like from one or more broadcast sources 109. Devices 102-106 are configured to monitor audio media exposure relating to their respective users in accordance with the principles set forth herein. Server 112 is typically connected to a communications network 110 whereto also the mobile terminals 102, 104, 106 are provided with access, e.g. via one or more access networks 108a, 108b, which may be cellular, wired or wireless local area networks, for instance. External entities 114 such as services/servers (114a, 114b) may be connected to the server arrangement 112 via the network 110 for obtaining, storing and processing audio code data received from devices 102-106 and related data derived therefrom and/or for providing supplementary data.

Figure 2:
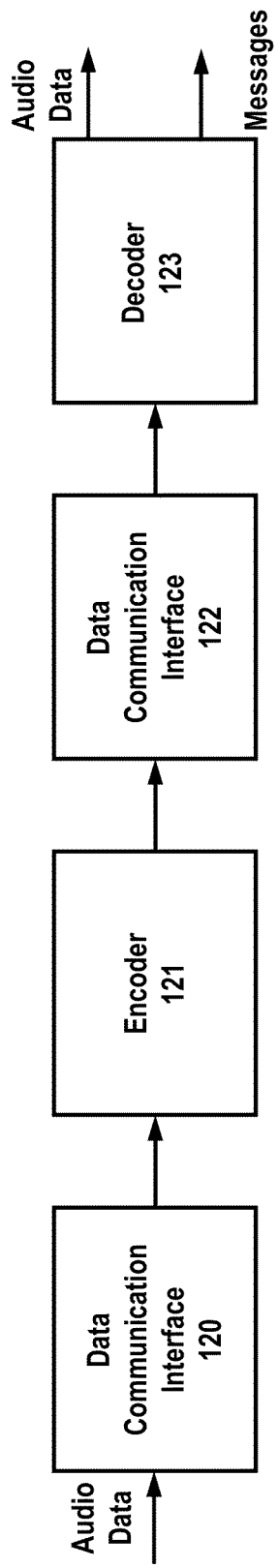
FIG. 2 is a functional block diagram of an example communications system incorporating an encoder and decoder.

FIG. 2 is an overview of example encoding and decoding processes and systems. The audio data represented in FIG. 2 can come in many forms. The audio data can be in a compressed or uncompressed format. The audio data can be previously encoded or unencoded. The audio data can be represented in the time domain or the frequency domain. The audio data can also have any combination of the foregoing audio data forms. Audio data, regardless of its form as described above, enters the system through a communications interface 120. This communications interface 120 utilizes any of the readily available technologies such as a serial port, parallel port, coaxial cable, twisted wire, infrared port, optical cable, microwave link, RF, wireless port, satellite link or the like.

The audio data then enters encoder 121 from communications interface 120. In encoder 121, in one mode of operation the audio data is encoded with multiple messages that share substantially single-frequency components. In another, the audio data as received by encoder 121 has a message encoded therein and encoder 121 encodes one or more additional messages in the audio data. The encoded audio data is then communicated via a communication interface 122. The communication interface 122 can come in any of multiple forms such as radio broadcasts, television broadcasts, DVDs, MP3s, compact discs, streaming music, streaming video, network data, mini-discs, multimedia presentations, personal address systems or the like. Decoder 123 then receives the communicated encoded audio data. Decoder 123 may be embodied as part of a receiver, a personal people meter, a computer device, or portable processing device, discussed in further detail below.

Decoder 123 is configured to detect encoded messages. As a result of the ability to retrieve the encoded messages, decoder 123 can therefore possess a myriad of functionality such as the relaying of information, e.g. providing the performing artist's name or providing audience estimating information, or controlling access, e.g. an encryption key scheme, or data transport, e.g. using the encoded messages as an alternate communications channel. Decoder 123 can possess the ability to reproduce the audio data but this is not essential. For example, a decoder 123 used for gathering audience estimate data can receive the audio data in acoustic form, in electrical form or otherwise from a separate receiver. In the case of an encryption key scheme, the reproduction of the audio data for an encryption key holder is the objective.

Figure 3:
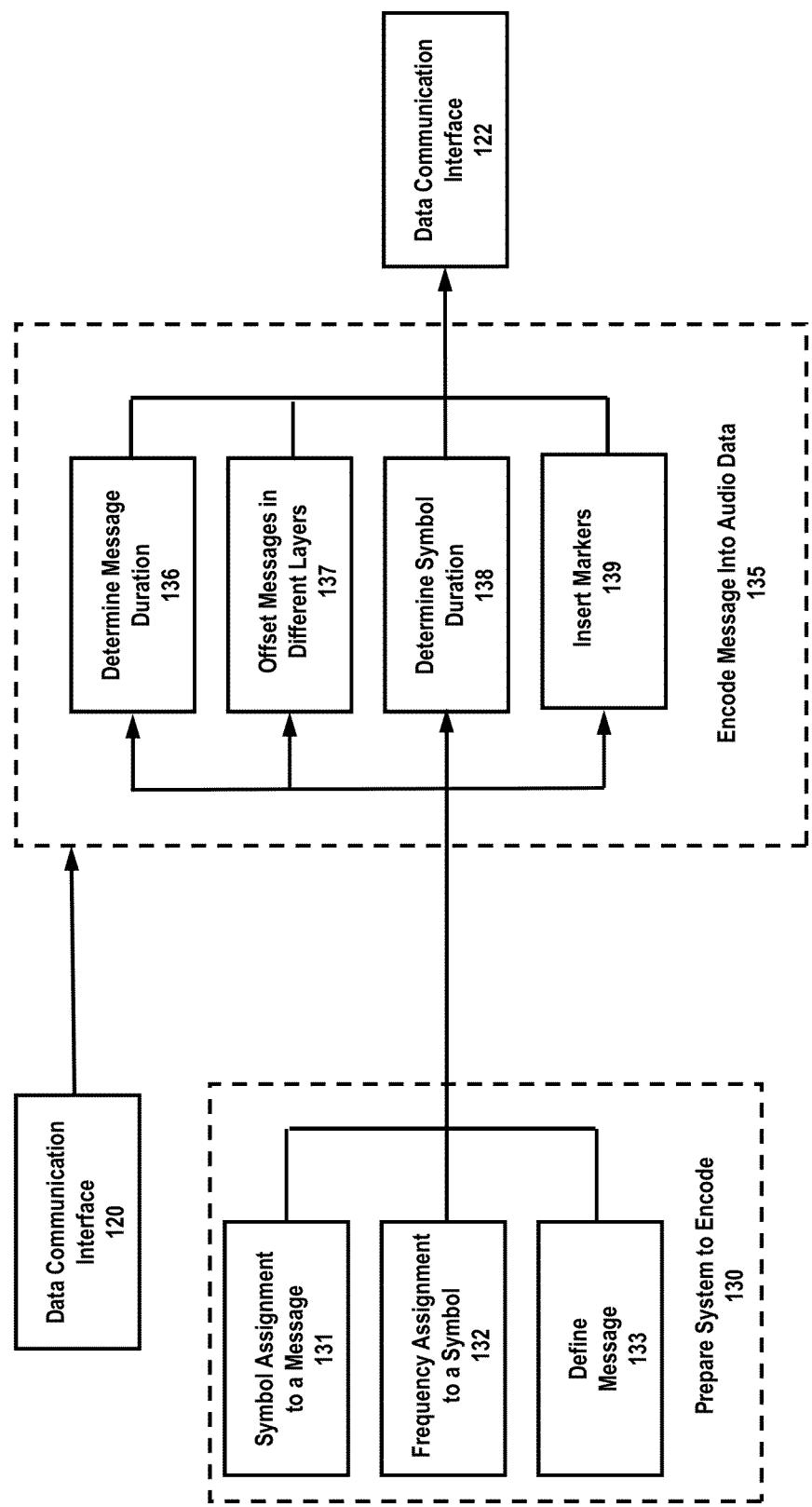
FIG. 3 is an overview of an example encoding process.

FIG. 3 is an overview of example encoding processes and systems. Block 130 illustrates a number of preferred preliminary operations 131-133 which are carried out in preparation for encoding one or more messages into audio data. As indicated by operation 133, the content of a message to be encoded is defined. In some examples this is achieved by selecting from a plurality of predefined messages, while in others the content of the message is defined through a user input or by data received from a further system. In still others the identity of the message content is fixed. Once the content of the message is known, a sequence of symbols is assigned to represent the message as indicated at 131. The symbols are selected from a predefined set preferably comprising alphanumeric code symbols. In some examples, the symbol sequences are pre-assigned to corresponding predefined messages. When a message to be encoded is fixed, as in a station ID message, operations 131 and 138 preferably are combined to define a single invariant message symbol sequence.

Operation 132 may be configured to assign a plurality of substantially single-frequency code components to each of the message symbols. When the message is encoded, each symbol of the message is represented in the audio data by its corresponding plurality of substantially single-frequency code components. Each of such code components preferably occupies only a narrow frequency band so that it may be distinguished from other such components as well as noise with a sufficiently low probability of error. It is recognized that the ability of an encoder or decoder to establish or resolve data in the frequency domain is limited, so that the substantially single-frequency components are represented by data within some finite or narrow frequency band. Moreover, there are circumstances in which is advantageous to regard data within a plurality of frequency bands as corresponding to a substantially single-frequency component. This technique is useful where, for example, the component may be found in any of several adjacent bands due to frequency drift, variations in the speed of a tape or disk drive, or even as the result of an incidental or intentional frequency variation inherent in the design of a system.

Once block 130 prepares symbols for encoding, they may be arranged as messages that may be separately or simultaneously embedded into audio using multiple layers. Some example processes for embedding such messages is described in U.S. Pat. No. 6,845,360, titled "Encoding Multiple Messages In Audio Data and Detecting Same," which is assigned to the assignee of the present application and is incorporated by reference in its entirety herein. In some examples, several message parameters may be selected singly or in combination in order to ensure that the first and second messages can be separately decoded. Block 135 represents multiple operations which serve to determine parameters of the message to be encoded either to distinguish it from a message previously encoded in the audio data or from one or more further messages also being encoded therein at the same time. One such parameter is the symbol interval, selected in operation 138 of FIG. 2. In some examples, the intervals of symbols within one or both messages can be separate or overlap to provide even greater bandwidth.

Operation 137 of FIG. 3 provides the ability to introduce an offset between messages to assist in distinguishing them especially in those examples in which the message durations and/or symbol intervals are the same. Although not required in all applications, messages may include a marker symbol which may have a fixed position in the message regardless of its informational content and is included through operation 139 in FIG. 2. Such a configuration enables the decoder 123 of FIG. 1 to determine the times of occurrence of each of the symbols. The marker symbol, like the other symbols, comprises a combination of substantially single-frequency values selected from the predefined set thereof. Because the offset between messages is fixed and known, it may be used along with the marker symbol by the decoder 123 in this example to locate the message symbols along the time base and detect them. In some examples the offset is used without reference to a marker symbol to separately detect the first and second messages. Operation 136 of FIG. 3 determines the duration of each of the messages, either in cooperation with operations 131 and 138 or by inserting padding data, as appropriate. Example message structures, along with variant message structures, are provided in connection with FIGS. 7 and 8, which are discussed in greater detail below.

Figure 4:
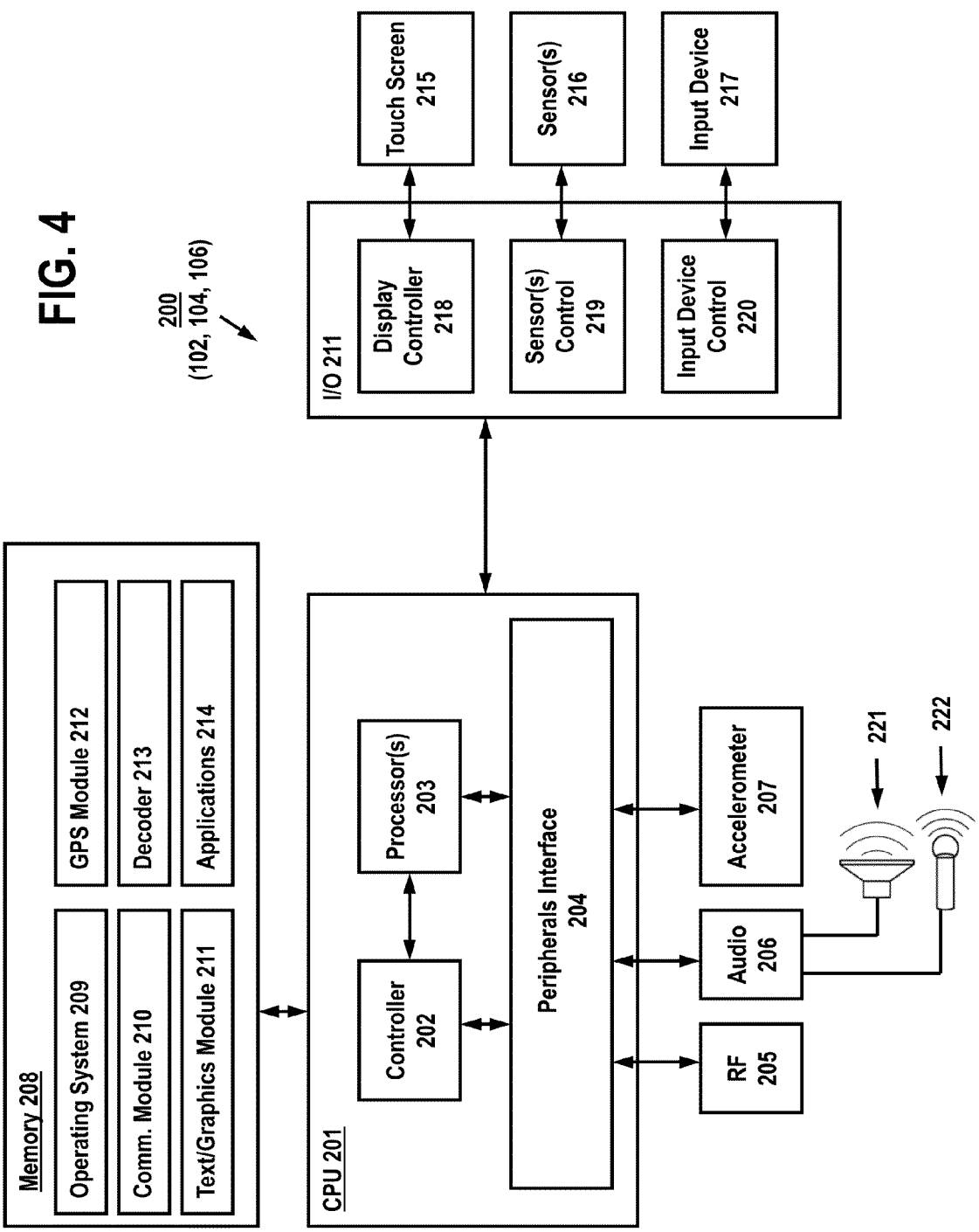
FIG. 4 is an example mobile terminal portable computing device configured to provide monitoring capabilities on a device.

FIG. 4 is an example of a portable computing device 200 which may function as a terminal (see references 102, 104 and 106 of FIG. 1), and may be a smart phone, tablet computer, laptop or the like. Device 200 may include a central processing unit (CPU) 201 (which may include one or more computer readable storage mediums), a memory controller 202, one or more processors 203, a peripherals interface 204, RF circuitry 205, audio circuitry 206, a speaker 220, a microphone 220, and an input/output (I/O) subsystem 211 having display controller 212, control circuitry for one or more sensors 213 and input device control 214. These components may communicate over one or more communication buses or signal lines in device 200. It should be appreciated that device 200 is only one example of a portable multifunction device 200, and that device 200 may have more or fewer components than shown, may combine two or more components, or a may have a different configuration or arrangement of the components. The various components shown in FIG. 2 may be implemented in hardware or a combination of hardware and software, including one or more signal processing and/or application specific integrated circuits.

In one example, decoder 213 may be configured as software tangibly embodied in memory 208, which may communicate with other software in memory 208 and CPU 201, as well as audio circuitry 206, and serves to decode ancillary data embedded in audio signals in order to detect exposure to media. Examples of techniques for encoding and decoding such ancillary data are disclosed in U.S. Pat. No. 6,871,180, titled "Decoding of Information in Audio Signals," issued Mar. 22, 2005, and are incorporated by reference in its entirety herein. Other suitable techniques for encoding data in audio data are disclosed in U.S. Pat. No. 7,640,141 to Ronald S. Kolessar and U.S. Pat. No. 5,764,763 to James M. Jensen, et al., which are incorporated by reference in their entirety herein. Other appropriate encoding techniques are disclosed in U.S. Pat. No. 5,579,124 to Aijala, et al., U.S. Pat. Nos. 5,574,962, 5,581,800 and 5,787,334 to Fardeau, et al., and U.S. Pat. No. 5,450,490 to Jensen, et al., each of which is assigned to the assignee of the present application and all of which are incorporated herein by reference in their entirety.

An audio signal which may be encoded with a plurality of code symbols may be received via data communication through RF interface 205 via audio circuitry 206, or through any other data interface allowing for the receipt of audio/visual data in digital form. Audio signals may also be received via microphone 222. Furthermore, encoded audio signals may be reproduced on device 200 through digital files stored in memory 208 and executed through one or more applications (214) stored in memory 208 such as a media player that is linked to audio circuitry 206. From the following description in connection with the accompanying drawings, it will be appreciated that decoder 213 is capable of detecting codes in addition to those arranged in the formats disclosed hereinabove. Memory 208 may also include high-speed random access memory (RAM) and may also include non-volatile memory, such as one or more magnetic disk storage devices, flash memory devices, or other non-volatile solid-state memory devices. Access to memory 208 by other components of the device 200, such as processor 203, decoder 213 and peripherals interface 204, may be controlled by the memory controller 202. Peripherals interface 204 couples the input and output peripherals of the device to the processor 203 and memory 208. The one or more processors 203 run or execute various software programs and/or sets of instructions stored in memory 208 to perform various functions for the device 200 and to process data. In some examples, the peripherals interface 204, processor(s) 203, decoder 213 and memory controller 202 may be implemented on a single chip, such as a chip 201. In some other examples, they may be implemented on separate chips.

The RF (radio frequency) circuitry 205 receives and sends RF signals, also known as electromagnetic signals. The RF circuitry 205 converts electrical signals to/from electromagnetic signals and communicates with communications networks and other communications devices via the electromagnetic signals. The RF circuitry 205 may include well-known circuitry for performing these functions, including but not limited to an antenna system, an RF transceiver, one or more amplifiers, a tuner, one or more oscillators, a digital signal processor, a CODEC chipset, a subscriber identity module (SIM) card, memory, and so forth. RF circuitry 205 may communicate with networks, such as the Internet, also referred to as the World Wide Web (WWW), an intranet and/or a wireless network, such as a cellular telephone network, a wireless local area network (LAN) and/or a metropolitan area network (MAN), and other devices by wireless communication. The wireless communication may use any of a plurality of communications standards, protocols and technologies, including but not limited to Global System for Mobile Communications (GSM), Enhanced Data GSM Environment (EDGE), high-speed downlink packet access (HSDPA), wideband code division multiple access (W-CDMA), code division multiple access (CDMA), time division multiple access (TDMA), Bluetooth, Wireless Fidelity (Wi-Fi) (e.g., IEEE 802.11a, IEEE 802.11b, IEEE 802.11g and/or IEEE 802.11n), voice over Internet Protocol (VoIP), Wi-MAX, a protocol for email (e.g., Internet message access protocol (IMAP) and/or post office protocol (POP)), instant messaging (e.g., extensible messaging and presence protocol (XMPP), Session Initiation Protocol for Instant Messaging and Presence Leveraging Extensions (SIMPLE), and/or Instant Messaging and Presence Service (IMPS)), and/or Short Message Service (SMS)), or any other suitable communication protocol, including communication protocols not yet developed as of the filing date of this document.

Audio circuitry 206, speaker 221, and microphone 222 provide an audio interface between a user and the device 200. Audio circuitry 206 may receive audio data from the peripherals interface 204, converts the audio data to an electrical signal, and transmits the electrical signal to speaker 221. The speaker 221 converts the electrical signal to human-audible sound waves. Audio circuitry 206 also receives electrical signals converted by the microphone 221 from sound waves, which may include encoded audio, described above. The audio circuitry 206 converts the electrical signal to audio data and transmits the audio data to the peripherals interface 204 for processing. Audio data may be retrieved from and/or transmitted to memory 208 and/or the RF circuitry 205 by peripherals interface 204. In some examples, audio circuitry 206 also includes a headset jack for providing an interface between the audio circuitry 206 and removable audio input/output peripherals, such as output-only headphones or a headset with both output (e.g., a headphone for one or both ears) and input (e.g., a microphone).

I/O subsystem 211 couples input/output peripherals on the device 200, such as touch screen 215 and other input/control devices 217, to the peripherals interface 204. The I/O subsystem 211 may include a display controller 218 and one or more input controllers 220 for other input or control devices. The one or more input controllers 220 receive/send electrical signals from/to other input or control devices 217. The other input/control devices 217 may include physical buttons (e.g., push buttons, rocker buttons, etc.), dials, slider switches, joysticks, click wheels, and so forth. In some other examples, input controller(s) 220 may be coupled to any (or none) of the following: a keyboard, infrared port, USB port, and a pointer device such as a mouse, an up/down button for volume control of the speaker 221 and/or the microphone 222. Touch screen 215 may also be used to implement virtual or soft buttons and one or more soft keyboards.

Touch screen 215 provides an input interface and an output interface between the device and a user. The display controller 218 receives and/or sends electrical signals from/to the touch screen 215. Touch screen 215 displays visual output to the user. The visual output may include graphics, text, icons, video, and any combination thereof (collectively termed "graphics"). In some examples, some or all of the visual output may correspond to user-interface objects. Touch screen 215 has a touch-sensitive surface, sensor or set of sensors that accepts input from the user based on haptic and/or tactile contact. Touch screen 215 and display controller 218 (along with any associated modules and/or sets of instructions in memory 208) detect contact (and any movement or breaking of the contact) on the touch screen 215 and converts the detected contact into interaction with user-interface objects (e.g., one or more soft keys, icons, web pages or images) that are displayed on the touch screen. In an example, a point of contact between a touch screen 215 and the user corresponds to a finger of the user. Touch screen 215 may use LCD (liquid crystal display) technology, or LPD (light emitting polymer display) technology, although other display technologies may be used in other examples. Touch screen 215 and display controller 218 may detect contact and any movement or breaking thereof using any of a plurality of touch sensing technologies now known or later developed, including but not limited to capacitive, resistive, infrared, and surface acoustic wave technologies, as well as other proximity sensor arrays or other elements for determining one or more points of contact with a touch screen 215.

Device 200 may also include one or more sensors 216 such as optical sensors that comprise charge-coupled device (CCD) or complementary metal-oxide semiconductor (CMOS) phototransistors. The optical sensor may capture still images or video, where the sensor is operated in conjunction with touch screen display 215. Device 200 may also include one or more accelerometers 207, which may be operatively coupled to peripherals interface 204. Alternately, the accelerometer 207 may be coupled to an input controller 214 in the I/O subsystem 211. The accelerometer is preferably configured to output accelerometer data in the x, y, and z axes.

In some examples, the software components stored in memory 208 may include an operating system 209, a communication module 210, a text/graphics module 211, a Global Positioning System (GPS) module 212, audio decoder 213 and applications 214. Operating system 209 (e.g., Darwin, RTXC, LINUX, UNIX, OS X, WINDOWS, or an embedded operating system such as VxWorks) includes various software components and/or drivers for controlling and managing general system tasks (e.g., memory management, storage device control, power management, etc.) and facilitates communication between various hardware and software components. Communication module 210 facilitates communication with other devices over one or more external ports and also includes various software components for handling data received by the RF circuitry 205. An external port (e.g., Universal Serial Bus (USB), Firewire, etc.) may be provided and adapted for coupling directly to other devices or indirectly over a network (e.g., the Internet, wireless LAN, etc.).

Text/graphics module 211 includes various known software components for rendering and displaying graphics on the touch screen 215, including components for changing the intensity of graphics that are displayed. As used herein, the term "graphics" includes any object that can be displayed to a user, including without limitation text, web pages, icons (such as user-interface objects including soft keys), digital images, videos, animations and the like. Additionally, soft keyboards may be provided for entering text in various applications requiring text input. GPS module 212 determines the location of the device and provides this information for use in various applications. Applications 214 may include various modules, including address books/contact list, email, instant messaging, video conferencing, media player, widgets, instant messaging, camera/image management, and the like. Examples of other applications include word processing applications, JAVA-enabled applications, encryption, digital rights management, voice recognition, and voice replication.

Returning briefly to the example of FIG. 1, user devices 102-106 may receive media received from a media source 112, which preferably provides network-based media, such as streaming media or digital media files. Media source 112 may comprise one or more servers (102a, 102b) communicatively linked to network 110, which may provide media to devices 102-105 via wired, wireless (108b) and/or cellular (108a) communication. It is understood that other media formats are possible in this disclosure as well (e.g., 109), including cable, satellite, distributed on storage media, or by any other means or technique that is humanly perceptible, without regard to the form or content of such data. As will be explained in further details below, device 200 receives encoded audio through a wired or wireless connection (e.g., 802.11g, 802.11n, Bluetooth, etc.). The encoded audio is natively decoded using decoding software 213. After the encoded audio is decoded, one or more messages are detected.

Figure 5:
FIG. 5 is an example software architecture for implementing a decoding application.

Turning to FIG. 5, an example architecture for decoding audio is provided for software stored in memory 208. It should be understood by those skilled in the art that the software disclosed herein are merely examples, and that hardware (or combination of hardware/software) equivalents may be used as well. The example of FIG. 5 is particularly advantageous in instances where a device receives and reproduces media containing audio. Other configurations, such as a device capturing ambient audio via a microphone, are contemplated in this disclosure as well. Preferably, for each of software 209-214, and particularly for audio decoder 213 are configured in the application layer 304, which sits at the top of the operating system stack and contains the frameworks that are most commonly used by the software. Application layer 304 is preferably configured under an Objective-C platform containing standard application interfaces (APIs) known in the art. Application layer 304 is configured to support multiple frameworks for allowing software to operate, including, but not limited to, a programming interface (e.g., Java, UIKit framework) for providing user interface management, application lifecycle management, application event handling, multitasking, data protection via encryption, data handling, inter-application integration, push notification, local notification, accessibility, and the like. Other frameworks known in the art may be utilized as well.

Media layer 303 may be configured to provide application layer 304 with audio, video, animation and graphics capabilities. As with the other layers comprising the stack of FIG. 3, the media layer comprises a number of frameworks that may be supported. In addition to frameworks for graphic and video support, media layer 303 may be configured to support an audio framework (Objective-C, Java) configured to allow the playback and management of audio content A core audio framework would be responsible for supporting various audio types, playback of audio files and streams and also provide access to device's 200 built-in audio processing units. A media player framework in media layer 303 would advantageously support the playing of movies, music, audio podcast, audio book files, streaming media, stored media library files, etc. at a variety of compression standards, resolutions and frame rates.

Core services layer 302 comprises fundamental system services that all applications use, and also provides interfaces that use object-oriented abstractions for working with network protocols and for providing control over protocols stack and provide simplified use of lower-level constructs such as BSD sockets. Functions of core services layer 302 provide simplified tasks such as communicating with FTP and HTTP servers or resolving DNS hosts. Core OS layer 301 is the deepest layer of the architecture of FIG. 3 and provides an interface between existing hardware and system frameworks. Core OS Layer 301 comprises the kernel environment, drivers, and basic interfaces of the operating system. Many functions including virtual memory system, threads, file system, network, and inter-process communication is managed by the kernel. It should be understood by those skilled in the art that the example of FIG. 5 describes a software architecture based on multiple abstraction layers (e.g., iOS). Other suitable architectures incorporating media players and audio reproduction are contemplated as well. As one example, the software architecture may be based on a Linux kernel comprising middleware, libraries and APIs written in C, and application software running on an application framework which includes Java-compatible libraries based on Apache Harmony and the like.

Figure 6:
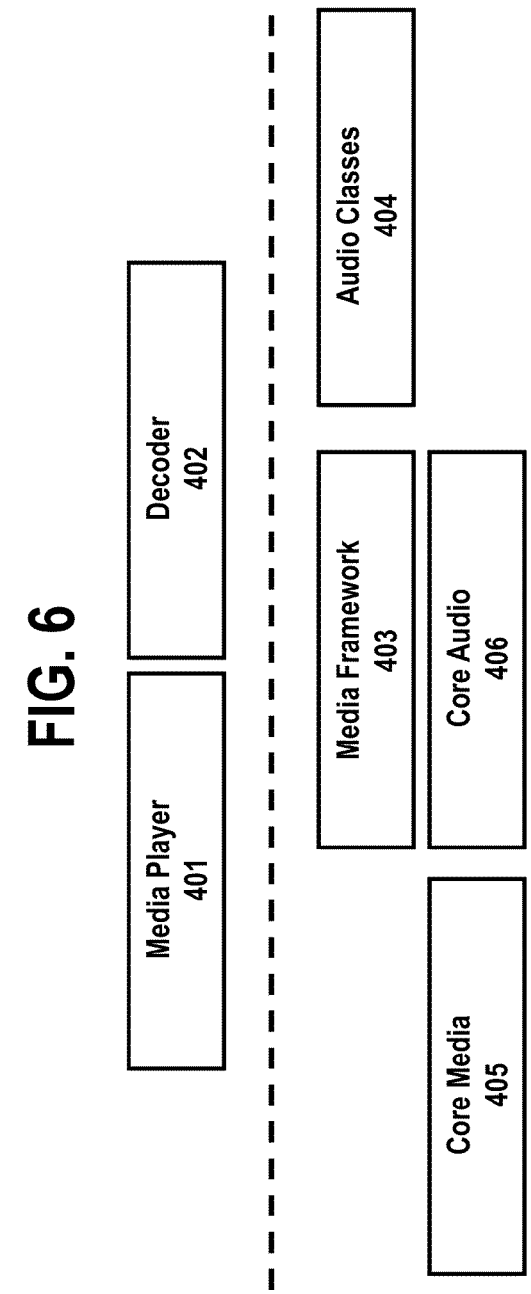
FIG. 6 is an example framework for media reproduction and decoding.

Turning to FIG. 6, an example is provided of a media reproduction software architecture that may be utilized in any of the examples described above. In this example, media player 401 and audio decoder 402 are preferably configured in an application layer (304) for device 200, in which each is communicatively coupled to each other and to lower layer modules 403-406 (shown separated by the dashed line in FIG. 4). Media player 401 may be configured to control playback of audio/visual (A/V) media locally using media framework 403, subject to audio classes 404 defined for the player (e.g., AVAudioPlayer). A device may also play A/V media via embedded web content classes (e.g. UIWebView, QT Web View) or play HTTP live streams by initializing an instance of a media player item (e.g., AVPlayerItem) using a URL. Primitive data structures for media framework 403, including time-related data structures and opaque objects to carry and describe media data may be defined in core media framework 405. Supported audio types, playback and recording of audio files and streams may be defined in core audio 406 and may also provide access to the device's built-in audio processing units.

During one example mode of operation, which will be discussed in greater detail below, the audio portion of media played using media player 401 is stored and/or forwarded to decoder application 402. Using one or more techniques described herein below, decoder 402 processes the audio portion to detect if ancillary codes are present within the audio. If present, the ancillary codes are read, stored, and ultimately transmitted to a remote or central location (114) where the codes may be further processed to determine characteristics (e.g., identification, origin, etc.) of the media and further determine media exposure for a user associated with a device (200) for audience measurement purposes.

Figure 7:
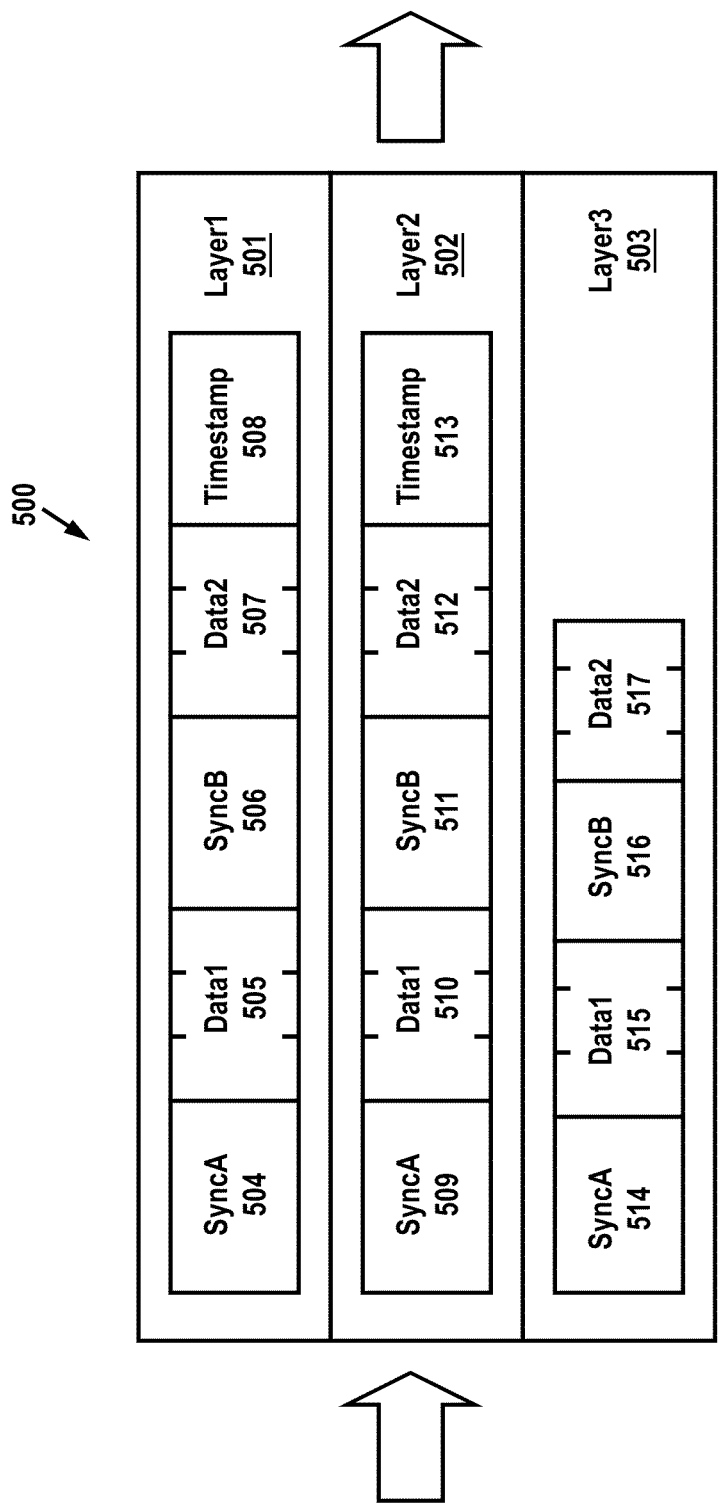
FIG. 7 is an example message structure for ancillary codes and/or messages that may be suitable for obtaining supplemental information.

With regard to encoding/decoding audio, FIG. 7 illustrates a message 500 that may be embedded/encoded into an audio signal. In this example, message 500 includes three or more layers that are inserted by encoders in a parallel format. Suitable encoding techniques are disclosed in U.S. Pat. No. 6,871,180, titled "Decoding of Information in Audio Signals," issued Mar. 22, 2005 and U.S. Pat. No. 6,845,360 titled "Encoding Multiple Messages in Audio Data and Detecting Same," which are assigned to the assignee of the present application, and are incorporated by reference in its entirety herein. Other suitable techniques for encoding data in audio data are disclosed in U.S. Pat. No. 7,640,141 to Ronald S. Kolessar and U.S. Pat. No. 5,764,763 to James M. Jensen, et al., which are also assigned to the assignee of the present application, and which are incorporated by reference in their entirety herein. Other appropriate encoding techniques are disclosed in U.S. Pat. No. 5,579,124 to Aijala, et al., U.S. Pat. Nos. 5,574,962, 5,581,800 and 5,787,334 to Fardeau, et al., and U.S. Pat. No. 5,450,490 to Jensen, et al., each of which is assigned to the assignee of the present application and all of which are incorporated herein by reference in their entirety.

When utilizing a multi-layered message, a plurality of layers may be present in an encoded data stream, and each layer may be used to convey different data. Turning to FIG. 7, message 500 includes a first layer 501 containing a message comprising multiple message symbols. During the encoding process, a predefined set of audio tones (e.g., ten) or single frequency code components are added to the audio signal during a time slot for a respective message symbol. At the end of each message symbol time slot, a new set of code components is added to the audio signal to represent a new message symbol in the next message symbol time slot. At the end of such new time slot another set of code components may be added to the audio signal to represent still another message symbol, and so on during portions of the audio signal that are able to psychoacoustically mask the code components so they are inaudible. Preferably, the symbols of each message layer are selected from a unique symbol set. In layer 501, each symbol set includes two synchronization symbols (also referred to as marker symbols) 504, 506, a larger number of data symbols 505, 507, and time code symbols 508. Time code symbols 508 and data symbols 905, 907 are preferably configured as multiple-symbol groups.

The second layer 502 of message 500 is illustrated having a similar configuration to layer 501, where each symbol set includes two synchronization symbols 509, 511, a larger number of data symbols 510, 512, and time code symbols 513. The third layer 503 includes two synchronization symbols 514, 516, and a larger number of data symbols 515, 517. The data symbols in each symbol set for the layers (501-503) should preferably have a predefined order and be indexed (e.g., 1, 2, 3). The code components of each symbol in any of the symbol sets should preferably have selected frequencies that are different from the code components of every other symbol in the same symbol set. In some examples, none of the code component frequencies used in representing the symbols of a message in one layer (e.g., Layer1 501) is used to represent any symbol of another layer (e.g., Layer2 502). In other examples, some of the code component frequencies used in representing symbols of messages in one layer (e.g., Layer3 503) may be used in representing symbols of messages in another layer (e.g., Layer1 501). However, in some examples, it is preferable that "shared" layers have differing formats (e.g., Layer3 503, Layer1 501) in order to assist the decoder in separately decoding the data contained therein.

Sequences of data symbols within a given layer are preferably configured so that each sequence is paired with the other and is separated by a predetermined offset. Thus, as an example, if data 905 contains code 1, 2, 3 having an offset of "2", data 507 in layer 501 would be 3, 4, 5. Since the same information is represented by two different data symbols that are separated in time and have different frequency components (frequency content), the message may be diverse in both time and frequency. Such a configuration is particularly advantageous where interference would otherwise render data symbols undetectable. In some examples, each of the symbols in a layer have a duration (e.g., 0.2-0.8 sec) that matches other layers (e.g., Layer1 501, Layer2 502). In other examples, the symbol duration may be different (e.g., Layer 2 502, Layer 3 503). During a decoding process, the decoder detects the layers and reports any predetermined segment that contains a code.

Figure 8:
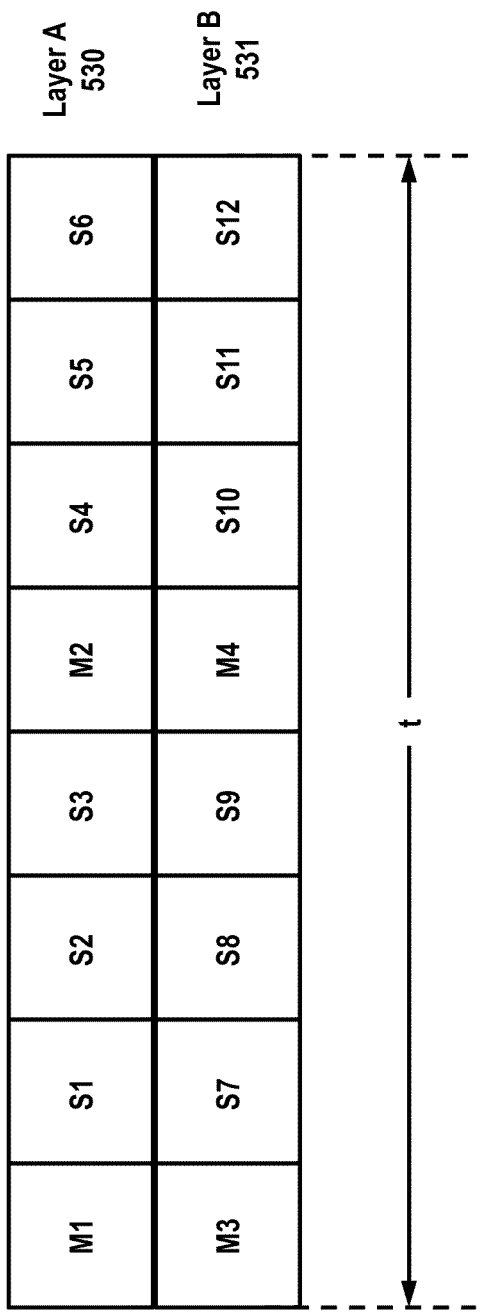

FIG. 8 illustrates another message structure, in which message layers may be "folded" onto each other to create what is, in effect, a single, synchronized, merged layer. Since a typical message symbol unit may be comprised of a set of N specific discrete frequency bins, a set of K associated symbol units can be assembled and merged so that none of the K symbol units share frequency bins. The merged layer may comprise N*K frequency bins. Thus, as an example, assuming an encoding bandwidth of 2000 Hertz, if 10 frequency bins (N) are used for 18 symbol units (K), the merged layer would be made up of 180*3.96025=703.125 Hertz of the total selected bandwidth. By properly selecting the frequencies of the symbol units, different layers in the merged layer may be formed sharing from 0 to the 180 total bins of a given reference layer. For example, using the example configuration of FIG. 7, Layer 1 501 may share 0 bins with the Layer 2 502, but, while Layer 3 503 may share bins with both Layer 1 and Layer 2. In another example, Layers 1 and 2 could have been selected to share the same 180 bins as long as the symbol units were selected properly to minimize symbol similarity.

The merged layer may be thought of as a process for encoding different layers of information at different point in the total audio chain such that multiple different message elements can be distinguished through detection observations. In certain (non-merged) applications, different code layers for audio are encoded at different physical locations (e.g., national broadcaster, local broadcaster, commercial distribution center, etc.) at different times. Since the encoding sites/locations may be widely separated in both time and location, the encoding of the layers is inherently asynchronous: messages on different layers have no set time relationship. By merging or "folding" the layers, multiple layers of information are permitted to exist; instead of using multiple different layers encoded at different points in the total audio chain to convey different message attributes (e.g., station identification), multiple different layers of information are combined in a time synchronous manner to create a message attribute or unified information set in one layer. Also, since the merged layer provides a more diverse platform for inserting codes, the numbers of different codes that may be used expand from tens of thousands of codes to billions. Such a configuration is particularly advantageous for use in non-linear media measurement and "on-demand" media.

In some examples, the merged or "folded" layers may comprise one layer similar to Layer 3 503 of FIG. 7, illustrated as Layer A 530 in FIG. 8, together with a merging layer (Layer B) 531. The message structure of Layer 3 503 is retained in Layer A for this example, except that the synchronization (or marker) symbols are replaced by checksums to allow error detection and correction across both portions of the merged message. The message duration may be a few seconds (e.g., 2-6 seconds) with a plurality of symbols (e.g., 8 symbols) each having a duration of milliseconds (e.g., 200-400 milliseconds). In some examples, no timestamp information is used. In some other examples, a time synchronous layer (e.g., Layer 2 and/or Layer 1) may be used to further expand the number of available codes. Such a configuration is particularly advantageous for on-demand media. Since the message duration of the additional layers (501, 502) is typically longer, additional or duplicate messages may be encoded in these layers. It should be understood by those skilled in the art that, while the present disclosure discusses the merging or "folding" of two layers, further additional layers may be merged as well. The merging of multiple layers offers a number of advantages over conventional encoding/decoding systems, including:

- The ability to simultaneously encode/decode multiple layers of information uses the same input processes up through the computationally expensive FFTs. This makes the encoding process more efficient.
- The simultaneous encoding of multiple layers of information is more inaudible than serial encoding since prior layer artifacts may be totally removed.
- Marker redundancy can be reduced allowing more symbols to be dedicated to data and error correction.
- The total number of available identification or characteristic codes can be greatly increased.
- Allows cross folded layer error detection and correction which improves the detection process through the reduction of false positives and erroneous detections.

In the simplified example of FIG. 8, Layer A 530, which may be a content layer, comprises message symbols S1-S3 and S4-S6, together with their respective marker symbols M1 and M2 and offset (offset1). Merging Layer B 531 comprises message symbols S7-S9 and S10-S12, together with respective checksums M3 and M4 and offset (offset2). During an encoding process the messages are structured such that (S4, S5, S6)=(S1, S2, S3)+offset1 and (S10, S11, S12)=(S7, S8, S9)+offset2 where,

M1=marker 1 (covering 17 data symbols), and

M2=marker 2 (covering 16 data symbols).

For encoding of checksums M3 and M4, the messages are structured such that

Checksum1=S1+S2+S3 (modulo 16)
and
Checksum2=S7+S8+S9 (modulo 16)
where,
M3=Checksum1+Checksum2 (modulo 16),
and
M4=Checksum1−Checksum2 (modulo 16).

Turning to FIG. 8A, another simplified example is provided using the structure of FIG. 8, where message "12345678" is to be encoded into a merged layer (Layer A+Layer B). As can be seen from the figure, symbols S1-S3 and S4-S6 (of Layer A) are respectively assigned the "1-3" and "5-7" portions of the message, where the "4" is reserved for checksum (M4). Symbols S7-S9 and S10-S12 (of Layer B) are respectively assigned "5-7" and "D-F" (Hex), where "8" is reserved for checksum (M3). As only two markers are needed for the merged layers in this example, marker symbol M1 represents 17 data symbols (16 data symbols+1 marker) and M2 represents 16 data symbols. By arranging the layers in this manner using the checksums, it can be appreciated that the message data may be effectively shared between the merged layers.

Figure 9:
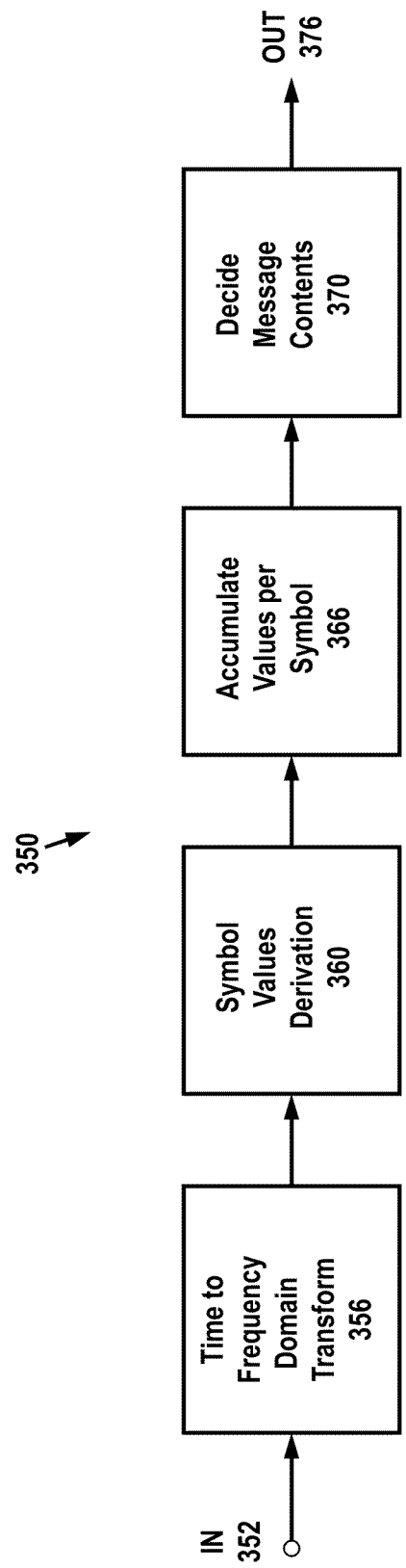
FIG. 9 illustrates an example decoding process.

FIG. 9 is a functional block diagram illustrating an example decoding algorithm. An audio signal which may be encoded as described herein with a plurality of code symbols is received at a digital input 352. The received audio signal may be from streaming media, otherwise communicated signal, or a signal reproduced from storage in a device. It may be a direct-coupled or an acoustically coupled signal. From the following description in connection with the accompanying drawings, it will be appreciated that decoder 350 is capable of detecting codes in addition to those arranged in the formats disclosed herein.

For received audio signals in the time domain, decoder 350 transforms such signals to the frequency domain by means of function 356. Function 356 preferably is performed by a digital processor implementing a fast Fourier transform (FFT) although a direct cosine transform, a chirp transform or a Winograd transform algorithm (WFTA) may be employed in the alternative. Any other time-to-frequency-domain transformation function providing the necessary resolution may be employed in place of these. It will be appreciated that in certain implementations, function 356 may also be carried out by filters, by an application specific integrated circuit, or any other suitable device or combination of devices. Function 356 may also be implemented by one or more devices which also implement one or more of the remaining functions illustrated in FIG. 9.

The frequency domain-converted audio signals are processed in a symbol values derivation function 360, to produce a stream of symbol values for each code symbol included in the received audio signal. The produced symbol values may represent, for example, signal energy, power, sound pressure level, amplitude, etc., measured instantaneously or over a period of time, on an absolute or relative scale, and may be expressed as a single value or as multiple values. Where the symbols are encoded as groups of single frequency components each having a predetermined frequency, the symbol values preferably represent either single frequency component values or one or more values based on single frequency component values. Function 360 may be carried out by a digital processor, which advantageously carries out some or all of the other functions of decoder 350. However, the function 360 may also be carried out by an application specific integrated circuit, or by any other suitable device or combination of devices, and may be implemented by apparatus apart from the means which implement the remaining functions of the decoder 350.

The stream of symbol values produced by the function 360 are accumulated over time in an appropriate storage device on a symbol-by-symbol basis, as indicated by function 366. In particular, function 366 is advantageous for use in decoding encoded symbols which repeat periodically, by periodically accumulating symbol values for the various possible symbols. For example, if a given symbol is expected to recur every X seconds, the function 366 may serve to store a stream of symbol values for a period of nX seconds (n>1), and add to the stored values of one or more symbol value streams of nX seconds duration, so that peak symbol values accumulate over time, improving the signal-to-noise ratio of the stored values. Function 366 may be carried out by a digital processor (or a DSP) which advantageously carries out some or all of the other functions of the decoder. However, the function 366 may also be carried out using a memory device separate from such a processor, or by an application specific integrated circuit, or by any other suitable device or combination of devices, and may be implemented by apparatus apart from the means which implements the remaining functions of the decoder 350.

The accumulated symbol values stored by the function 366 are then examined by the function 370 to detect the presence of an encoded message and output the detected message at an output 376. Function 370 can be carried out by matching the stored accumulated values or a processed version of such values, against stored patterns, whether by correlation or by another pattern matching technique. However, function 370 advantageously is carried out by examining peak accumulated symbol values, checksums and their relative timing, to reconstruct their encoded message from independent or merged layers. This function may be carried out after the first stream of symbol values has been stored by the function 366 and/or after each subsequent stream has been added thereto, so that the message is detected once the signal-to-noise ratios of the stored, accumulated streams of symbol values reveal a valid message pattern using the checksums.

Figure 10:
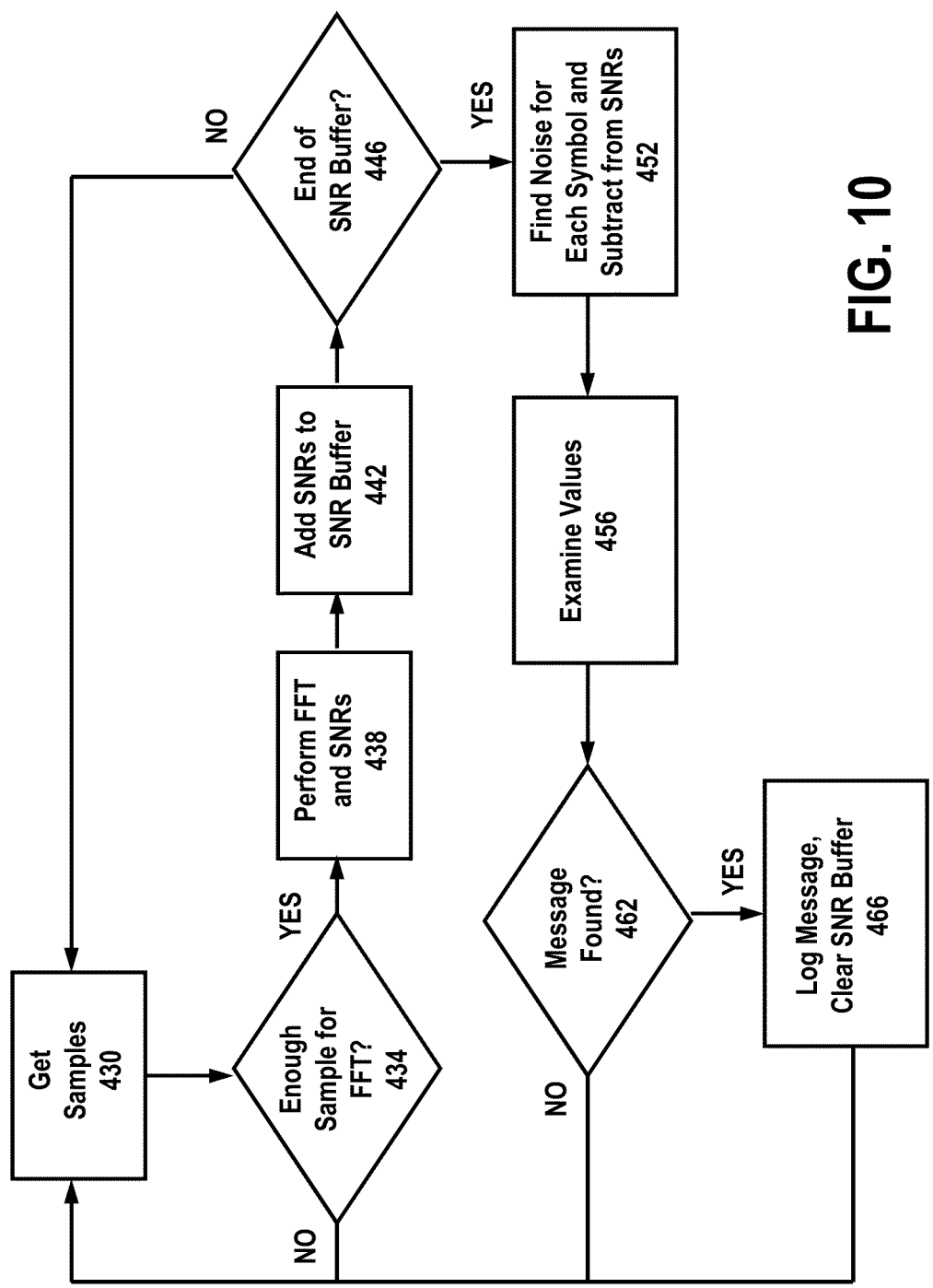
FIG. 10 is an example flow chart illustrating a methodology for retrieving ancillary code from an encoded audio signal.

FIG. 10 is a flow chart for an example decoder application. Step 430 is provided for those applications in which the encoded audio signal is received in analog form, for example, where it has been picked up by a microphone or an RF receiver. The decoder of FIG. 6 is particularly well adapted for detecting code symbols each of which includes a plurality of predetermined frequency components, e.g. ten components, within a frequency range of 1000 Hz to 3000 Hz. In this example, the decoder is designed specifically to detect a message having a specific sequence wherein each symbol occupies a specified time interval (e.g., 0.5 sec). In this example, it is assumed that the symbol set consists of twelve symbols, each having ten predetermined frequency components, none of which is shared with any other symbol of the symbol set. It will be appreciated that the decoder may readily be modified to detect different numbers of code symbols, different numbers of components, different symbol sequences, symbol durations, as well as components arranged in different frequency bands.

In order to separate the various components, a processor on device 200 repeatedly carries out FFTs on audio signal samples falling within successive, predetermined intervals. The intervals may overlap, although this is not required. In some examples, ten overlapping FFT's are carried out during each second of decoder operation. Accordingly, the energy of each symbol period falls within five FFT periods. The FFT's are preferably windowed, although this may be omitted in order to simplify the decoder. The samples are stored and, when a sufficient number are thus available, a new FFT is performed, as indicated by steps 434 and 438.

In this example, the frequency component values are produced on a relative basis. That is, each component value is represented as a signal-to-noise ratio (SNR), produced as follows. The energy within each frequency bin of the FFT in which a frequency component of any symbol can fall provides the numerator of each corresponding SNR Its denominator is determined as an average of adjacent bin values. For example, the average of seven of the eight surrounding bin energy values may be used, the largest value of the eight being ignored in order to avoid the influence of a possible large bin energy value which could result, for example, from an audio signal component in the neighborhood of the code frequency component. Also, given that a large energy value could also appear in the code component bin, for example, due to noise or an audio signal component, the SNR is appropriately limited. In this example, if SNR>6.0, then SNR is limited to 6.0, although a different maximum value may be selected. The ten SNR's of each FFT and corresponding to each symbol which may be present, are combined to form symbol SNR's which are stored in a circular symbol SNR buffer, as indicated in step 442. In certain examples, the ten SNR's for a symbol are simply added, although other ways of combining the SNR's may be employed. The symbol SNR's for each of the twelve symbols, markers and checksums are stored in the symbol SNR buffer as separate sequences, one symbol SNR for each FFT for the sequence of FFT's. After the values produced in the FFT's have been stored in the symbol SNR buffer, new symbol SNR's are combined with the previously stored values, as described below.

When the symbol SNR buffer is filled, this is detected in a step 446. In some examples, the stored SNR's are adjusted to reduce the influence of noise in a step 452, although this step may be optional. In this optional step, a noise value is obtained for each symbol (row) in the buffer by obtaining the average of all stored symbol SNR's in the respective row each time the buffer is filled. Then, to compensate for the effects of noise, this average or "noise" value is subtracted from each of the stored symbol SNR values in the corresponding row. In this manner, a "symbol" appearing only briefly, and thus not a valid detection, may be averaged out over time.

After the symbol SNR's have been adjusted by subtracting the noise level, the decoder attempts to recover the message by examining the pattern of maximum SNR values in the buffer in a step 456. In some examples, the maximum SNR values for each symbol are located in a process of successively combining groups of five adjacent SNR's, by weighting the values in the sequence in proportion to the sequential weighting (6 10 10 10 6) and then adding the weighted SNR's to produce a comparison SNR centered in the time period of the third SNR in the sequence. This process is carried out progressively throughout the five FFT periods of each symbol. For example, a first group of five SNR's for a specific symbol in FFT time periods (e.g., 1-5) are weighted and added to produce a comparison SNR for a specific FFT period (e.g., 3). Then a further comparison SNR is produced using the SNR's from successive FFT periods (e.g., 2-6), and so on until comparison values have been obtained centered on all FFT periods. However, other means may be employed for recovering the message. For example, either more or less than five SNR's may be combined, they may be combined without weighing, or they may be combined in a non-linear fashion.

After the comparison SNR values have been obtained, the decoder algorithm examines the comparison SNR values for a message pattern. In some preferred examples, the synchronization ("marker") code symbols are located first. Once this information is obtained, the decoder attempts to detect the peaks of the data symbols. The use of a predetermined offset between each data symbol in the first segment and the corresponding data symbol in the second segment provides a check on the validity of the detected message. That is, if both markers are detected and the same offset is observed between each data symbol in the first segment and its corresponding data symbol in the second segment, it is highly likely that a valid message has been received. If this is the case, the message is logged, and the SNR buffer is cleared 466. It is understood by those skilled in the art that decoder operation may be modified depending on the structure of the message, its timing, its signal path, the mode of its detection, etc., without departing from the scope of the teachings of this disclosure. For example, in place of storing SNR's, FFT results may be stored directly for detecting a message.

Figure 11:
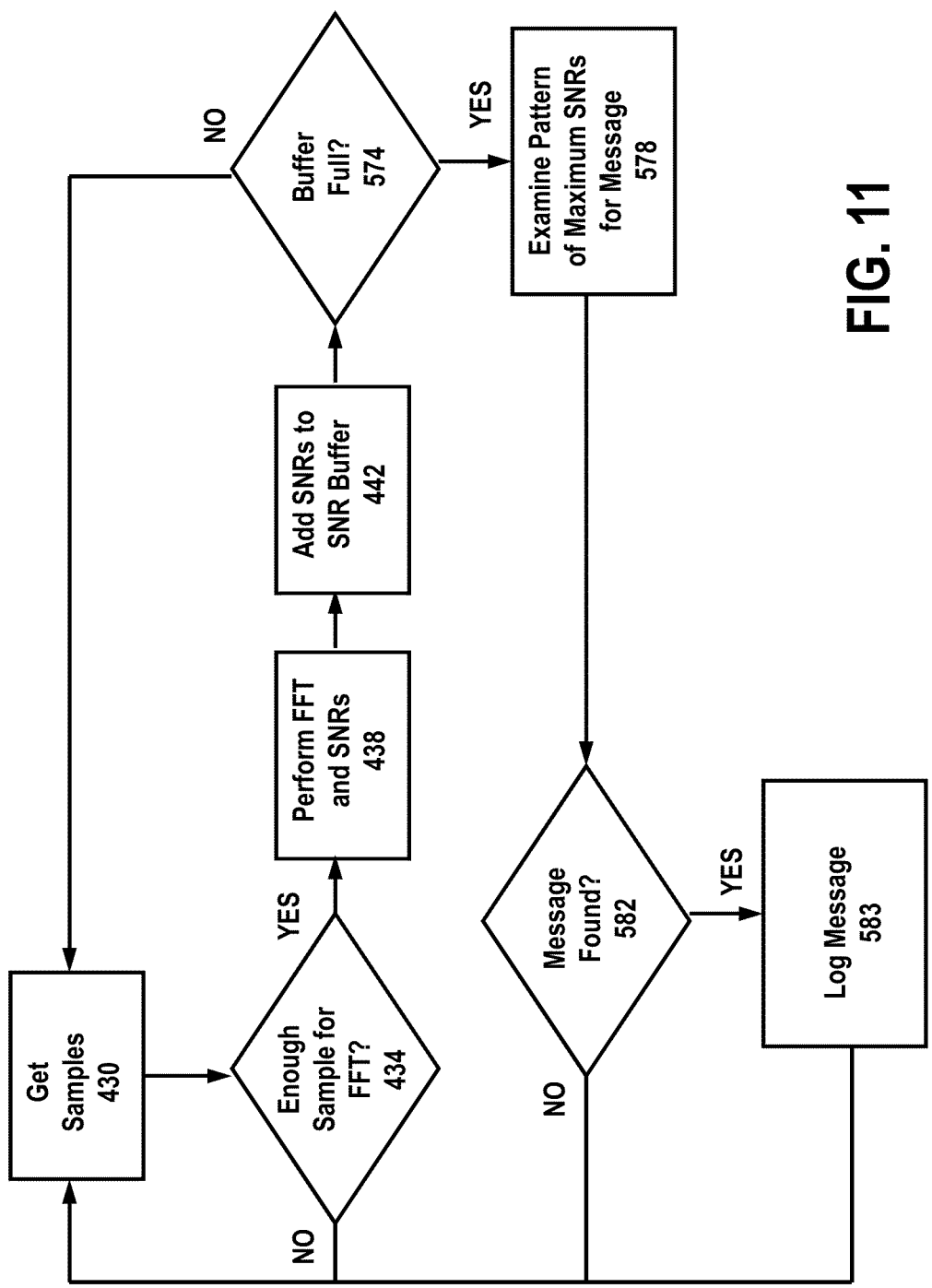
FIG. 11 is an example flow chart illustrating another methodology for retrieving ancillary code from an encoded audio signal.

FIG. 11 is a flow chart for another example decoder configuration implemented by means of a processor controlled by a decoder application. The decoder application of FIG. 8 is especially adapted to detect a repeating sequence of code symbols (e.g., 5 code symbols) consisting of a marker symbol followed by a plurality (e.g., 4) data symbols wherein each of the code symbols includes a plurality of predetermined frequency components and has a predetermined duration (e.g., 0.5 sec) in the message sequence. It is assumed in this example that each symbol is represented by ten unique frequency components and that the symbol set includes twelve different symbols. It is understood that this example may readily be modified to detect any number of symbols, each represented by one or more frequency components.

Steps employed in the decoding process illustrated in FIG. 11 which correspond to those of FIG. 10 are indicated by the same reference numerals, and these steps consequently are not further described. The FIG. 11 example uses a circular buffer which is twelve symbols wide by 150 FFT periods long. Once the buffer has been filled, new symbol SNRs each replace what are than the oldest symbol SNR values. In effect, the buffer stores a fifteen second window of symbol SNR values. As indicated in step 574, once the circular buffer is filled, its contents are examined in a step 578 to detect the presence of the message pattern. Once full, the buffer remains full continuously, so that the pattern search of step 578 may be carried out after every FFT.

Since each five symbol message repeats every 2½ seconds, each symbol repeats at intervals of 2½ seconds or every 25 FFT's. In order to compensate for the effects of burst errors and the like, the SNR's R1 through R150 are combined by adding corresponding values of the repeating messages to obtain 25 combined SNR values SNRn, n=1, 2 . . . 25, as follows:

$$SNR_n = \sum_{i=0}^{5} R_{n+25i}$$

Accordingly, if a burst error should result in the loss of a signal interval i, only one of the six message intervals will have been lost, and the essential characteristics of the combined SNR values are likely to be unaffected by this event. Once the combined SNR values have been determined, the decoder detects the position of the marker symbol's peak as indicated by the combined SNR values and derives the data symbol sequence based on the marker's position and the peak values of the data symbols. Once the message has thus been formed, as indicated in steps 582 and 583, the message is logged. However, unlike the example of FIG. 10 the buffer is not cleared. Instead, the decoder loads a further set of SNR's in the buffer and continues to search for a message. Similar error correction techniques described above may also be used.

As in the decoder of FIG. 10, it will be apparent from the foregoing to modify the decoder of FIG. 11 for different message structures, message timings, signal paths, detection modes, etc., without departing from the scope of the teachings of this disclosure. For example, the buffer of FIG. 11 may be replaced by any other suitable storage device; the size of the buffer may be varied; the size of the SNR values windows may be varied, and/or the symbol repetition time may vary. Also, instead of calculating and storing signal SNR's to represent the respective symbol values, a measure of each symbol's value relative to the other possible symbols, in some examples, a ranking of each possible symbol's magnitude is used.

In a further variation which is especially useful in audience measurement applications, a relatively large number of message intervals are separately stored to permit a retrospective analysis of their contents to detect a media content change. In another example, multiple buffers are employed, each accumulating data for a different number of intervals for use in the decoding method of FIG. 11. For example, one buffer could store a single message interval, another two accumulated intervals, a third four intervals and a fourth eight intervals. Separate detections based on the contents of each buffer are then used to detect a media content change.

In another example, the checksums and offsets described above may be used as "soft metrics" to decode merged messages and correct any existing errors. Specifically, a multi-step process is used to calculate the soft metric of each symbol. First, the bin SNR is calculated for a given period of time as described above. Next, the bin SNRs are added to form symbol SNR for a given period of time. Symbol SNRs are then added across multiple periods of time that correspond to a message symbol interval, with weighting to compensate for the effects of the FFT window, and noise subtraction for that symbol within other portions of the message. Each weighted symbol SNR is taken from the previous step in each message position, and divided by the sum of all other weighted symbol SNRs for that message position. These results are then preferably scaled (or optionally squared), resulting in a "ratio of ratios," which is represents a "score" or value of how strong each symbol is relative to its neighbors within the same message position. Applying these soft metrics, the decoder may find any cases that violate the encoded message structure in FIG. 8, and then iteratively performs combinations of error corrections to find a solution with the strongest set of symbol soft metrics (values). Additionally, if the winning soft metrics are too low (i.e. below some threshold), the corrected message may be discarded, or marked as suspicious, due to a higher probability of false positives.

As an example, using Reed-Solomon error correction (15, 9) the system can correct (15−9)/2=3 symbol errors. Using additional passes in the example, and considering the symbols with the lowest "soft metrics," up to 6 symbol errors may be corrected. Generally speaking, in coding theory, Reed-Solomon (RS) codes are non-binary cyclic error-correcting codes for detecting and correcting multiple random symbol errors. By adding t check symbols to the data, a RS code can detect any combination of up to t erroneous symbols, or correct up to t/2 symbols. As an erasure code, RS code can correct up to t known erasures, or it can detect and correct combinations of errors and erasures. Furthermore, RS codes are suitable as multiple-burst bit-error correcting codes, since a sequence of b+1 consecutive bit errors can affect at most two symbols of size b. The choice of t is up to the designer of the code, and may be selected within wide limits.

Turning to FIG. 12, one example of a Reed-Solomon (15,9) configuration is illustrated, where the symbols with the maximum metrics (value) for each message position (1-15) are highlighted. In this example, a plurality of passes (e.g., 1-7) are made over the message symbols until a valid message is found. Under an example first step, the highest soft metric value at each message position is processed and identified (100, 110, 60, 97, 107, 93, etc.), and a threshold metric or value may be set. In an example first pass, the same values are identified, except that the lowest value, found in message symbol position 11 (50), is assumed to be erroneous, especially if it is below the threshold value. The passes may continue on the message to identify further lowest values, until a certain number of invalid values are identified. Thus, continuing the process through seven passes, the example results would be:

Pass 2: message symbol position 10 is identified having the next lowest value (52);

Pass 3: message symbol position 14 is identified having the next lowest value (54);

Pass 4: message symbol position 3 is identified having the next lowest value (60);

Pass 5: message symbol position 12 is identified having the next lowest value (62); and Pass 6: message symbol position 13 is identified having the next lowest value (70).

After the last pass, message positions 11, 10, 14, 3, 12, 13 would be assumed to be errors (erasures), as they are the lowest maximum values.

Figure 13:
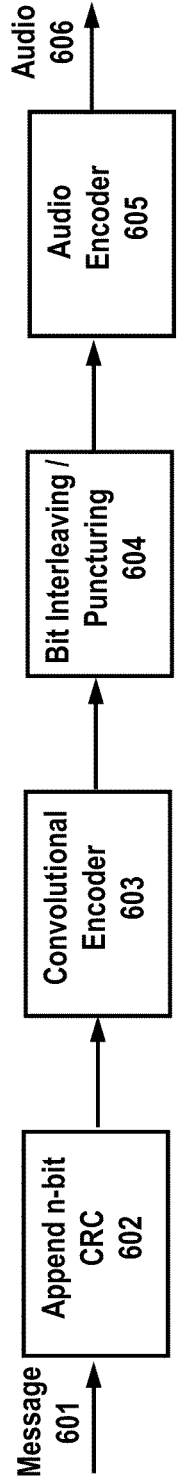
FIGS. 13 and 14 are other examples s covering techniques for error correction on an encoded audio signal.

It is understood by those skilled in the art that other error correction techniques are applicable as well. One such technique involves the use of a convolutional encoder/decoder, which may be incorporated as part of any of the audio encoders/decoders described herein. FIG. 13 provides one example of a convolutional encoder configured to utilize the soft metrics described above to drive a soft output Viterbi decoder shown in FIG. 14. The encoder block diagram of FIG. 13 has a message ID 501 that has an n-bit CRC appended in 602. In one example, the encoder may append a 16 bit CRC to a 38-bit message, which would result in a 54 bit input to convolutional encoder 603. Using r=⅓, the convolutional encoder may output a 162 bit string to bit interleaving and puncturing block 604, which may output a 156 bit string to audio encoder 605, which uses the string for error correction in the audio encoding described above.

Figure 14:
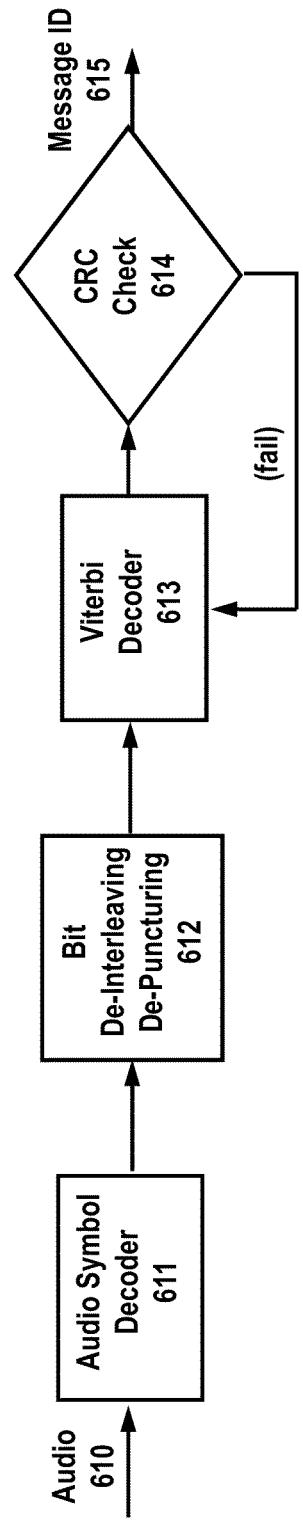

Continuing with the example, a decoding process is illustrated in FIG. 14, where error-corrected encoded audio 610 is received in audio symbol decoder 611, which subjects the audio (156 bytes) to bit interleaving and de-puncturing in block 612. The resulting 162 bytes are used in soft Viterbi decoder 613 to produce the 54 bits that are used in CRC check 614 for error correction. If the CRC check fails, the process reverts to Viterbi decoder 613. If the CRC check passes, the decoded message ID 615 from the audio is read out.

Figure 15:
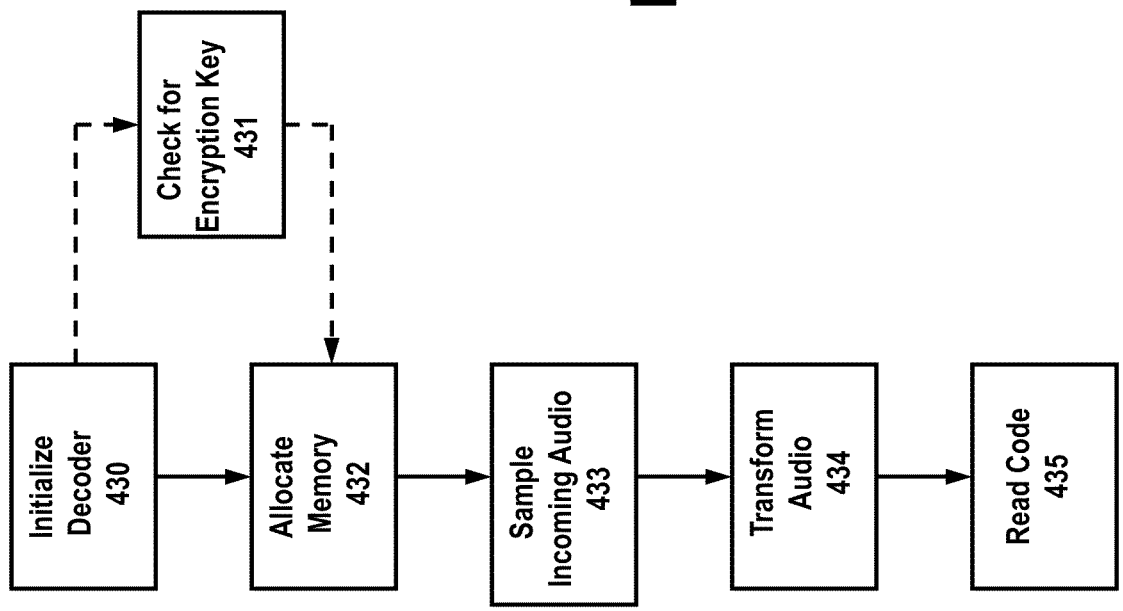
FIG. 15 is an example flow diagram for executing a decoder application on a processing device.

Turning to FIG. 15, an example decoder interface process is disclosed, where device (200) executes a decoder operation. The decoder in this example may be written in C, or any suitable code known in the art. At the beginning, a current version of the decoder is called and initialized in 430. At this point, use of the decoder may be dependent upon the satisfaction of an encryption key 431, which may be advantageous for limiting use of the decoder only to authorized users. The decoder interface security may comprise a required file containing encrypted decoder initialization parameters that may be used as an input for the decoder. The parameters may include pointer(s) to decoder memory, size of the decoder memory, pointer to encrypted decoder initialization parameters and pointer to an encryption key provided by the research entity, if not supplied to the application as a compile-time switch. Of course, if security is not an issue, the encryption steps may be omitted. Once any security/encryption is satisfied, the decoder loads initialization parameters that include allocating memory for audio decoding in step 432. Preferably, memory is allocated prior to executing other functions in the decoder. As audio is received in device 200, the audio is sampled 433 and transformed (e.g., FFT) in 434. As one example, the sampled audio may comprise 2048 16-bit monophonic audio samples obtained through an 8 k sample rate, while the transformation may result in 1024 FFT bin results. During the decoding process, may use the initialized pointer to access decoder memory to obtain arrays(s) of transformed bin powers returned from the transformations, and utilize them to read code in 435. Once the code is read it may be stored in memory and transmitted to a remote location for audience measurement purposes.

In another example, multiple instances of the decoder may be initialized multiple times using different memory areas. In such a case, the decoder application would be responsible for keeping track of which memory pointers are used in subsequent calls to initialize and retrieve code from the proper decoder.

In the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A method, comprising:
    collecting an encoded audio signal containing multiple synchronized layers of data symbols;
    converting, with a processor, a first set of audio samples in the encoded audio signal to a first frequency domain representation that includes substantially single-frequency code components having corresponding frequency component values;
    generating, with the processor, based on characteristics of the frequency component values, streams of symbol values corresponding to a set of the data symbols that may have been encoded in the encoded audio signal, the data symbols corresponding to respective subsets of the substantially single-frequency code components;
    accumulating, with the processor, the streams of the symbol values;
    detecting, with the processor, a presence of a first one of the data symbols from the accumulated streams of symbol values in a first one of the synchronized layers by matching a first one of the accumulated streams of symbol values to a first one of the subsets of the substantially single-frequency code components;
    detecting, with the processor, a presence of a second one of the data symbols from the accumulated streams of symbols values in a second one of the synchronized layers by matching a second one of the accumulated streams of symbols values to a second one of the subsets of the substantially single-frequency code components; and
    determining, with the processor, message contents of the synchronized layers in the encoded audio signal based on the presence of the first one of the data symbols in the first one of the synchronized layers and based on the presence of the second one of the data symbols in the second one of the synchronized layers.

2. A method as defined in claim 1, wherein the data symbols respectively correspond to different ones of multiple non-overlapping subsets of the substantially single-frequency code components, and detecting of the presence of the first one of the data symbols includes comparing signal to noise ratio values of a first one of the non-overlapping subsets of the substantially single-frequency code components to a threshold.

3. A method as defined in claim 1, wherein the generating of the streams of symbol values includes:
    calculating first characteristic values from the frequency component values for respective ones of the substantially single-frequency code components in a first one of the sets of the substantially single-frequency code components that corresponds to a first one of the data symbols; and
    calculating second characteristic values from the frequency component values for respective ones of the substantially single-frequency code components in a second one of the sets of the substantially single-frequency code components that corresponds to a second one of the data symbols.

4. A method as defined in claim 3, further including converting a second set of audio signal samples in the encoded audio signal to a second frequency domain representation that includes second frequency component values corresponding to the substantially single-frequency code components, the generating of the streams of symbol values including:
    calculating third characteristic values from the second frequency component values for respective ones of the substantially single-frequency code components in the first one of the sets of the substantially single-frequency code components; and
    calculating fourth characteristic values from the second frequency component values for respective ones of the substantially single-frequency code components in the second one of the sets of the substantially single-frequency code components.

5. A method as defined in claim 4, wherein the accumulating of the streams of symbol values includes adding the first characteristic values and the third characteristic values to generate a first one of the accumulated streams of symbol values, and adding the second characteristic values to the fourth characteristic values to generate a second one of the accumulated streams of symbol values.

6. A method as defined in claim 3, wherein the calculating of the first characteristic values includes:
    determining a first energy of a first one of the substantially single-frequency code components that corresponds to the first one of the data symbols;
    determining a total energy of a subset of the substantially single-frequency code components including the first one of the substantially single-frequency code components; and calculating the first characteristic as a signal to noise ratio as the ratio between the first energy and the total energy.

7. A method as defined in claim 1, wherein the detecting of the presence of the first one of the data symbols from the accumulated streams of symbol values includes comparing the first one of the accumulated streams of symbol values to a first set of characteristics that are representative of a synchronization symbol, the synchronization symbol being one of the data symbols.

8. A method as defined in claim 7, wherein the detecting of the presence of the second one of the data symbols from the accumulated streams of symbol values includes comparing the second one of the accumulated streams of symbol values to a second set of characteristics that are representative of a second one of the data symbols, the method further including:
- detecting a presence of a third one of the data symbols from the accumulated streams of symbol values based on a second set of audio signal samples occurring after the first set of audio signal samples;
- detecting a presence of a fourth one of the data symbols from the accumulated streams of symbol values based on the second set of audio signal samples;
- determining a first offset between a value of the synchronization symbol and a value of the second one of the symbols;
- determining a second offset between a value of the third one of the data symbols and a fourth one of the data symbols; and
- when the first offset is not equal to the second offset, performing error correction on at least one of the first, second, third, or fourth ones of the data symbols.

9. A decoder, comprising:
- a first decoder circuit to collect an encoded audio signal containing multiple synchronized layers of data symbols and to convert a first set of audio signal samples in the encoded audio signal to a first frequency domain representation that includes single-frequency code components having corresponding frequency component values;
- a second decoder circuit to generate, based on characteristics of the frequency component values, streams of symbol values corresponding to a set of the data symbols that may have been encoded in the encoded audio signal, the data symbols corresponding to respective subsets of the substantially single-frequency code components;
- a third decoder circuit to accumulate the streams of symbol values; and
- a fourth decoder circuit to:
  - detect a presence of a first one of the data symbols from the accumulated streams of symbol values in a first one of the synchronized layers by matching a first one of the accumulated streams of symbol values to a first one of the subsets of the substantially single-frequency code components;
  - detect a presence of a second one of the data symbols from the accumulated streams of symbols values in a second one of the synchronized layers by matching a second one of the accumulated streams of symbols values to a second one of the subsets of the substantially single-frequency code components; and
  - determine message contents of the synchronized layers in the encoded audio signal based on the presence of the first one of the data symbols in the first one of the synchronized layers and based on a presence of the second one of the data symbols in the second one of the synchronized layers.

10. A decoder as defined in claim 9, wherein the data symbols correspond to a different respective one of multiple non-overlapping subsets of the substantially single-frequency code components, and the fourth decoder circuit is to detect the presence of the first one of the data symbols by comparing signal to noise ratio values of a first one of the non-overlapping subsets of the substantially single-frequency code components to a threshold.

11. A decoder as defined in claim 9, wherein the second decoder circuit is to generate the streams of symbol values by:
- calculating first characteristic values from the frequency component values for respective ones of the substantially single-frequency code components in a first one of the sets of the substantially single-frequency code components that corresponds to a first one of the data symbols; and
- calculating second characteristic values from the frequency component values for respective ones of the substantially single-frequency code components in a second one of the sets of the substantially single-frequency code components that corresponds to a second one of the data symbols.

12. A decoder as defined in claim 11, wherein the first decoder circuit is to convert a second set of audio signal samples in the encoded audio signal to a second frequency domain representation that includes second frequency component values corresponding to the substantially single-frequency code components, and the second decoder circuit is to generate of the streams of symbol values by:
- calculating third characteristic values from the second frequency component values for respective ones of the substantially single-frequency code components in the first one of the sets of the substantially single-frequency code components; and
- calculating fourth characteristic values from the second frequency component values for respective ones of the substantially single-frequency code components in the second one of the sets of the substantially single-frequency code components.

13. A decoder as defined in claim 12, wherein the third decoder circuit is to accumulate the streams of symbol values by adding the first characteristic values and the third characteristic values to generate a first one of the accumulated streams of symbol values, and adding the second characteristic values to the fourth characteristic values to generate a second one of the accumulated streams of symbol values.

14. A decoder as defined in claim 11, wherein the second decoder circuit is to calculate the first characteristic values by:
- determining a first energy of a first one of the substantially single-frequency code components that corresponds to the first one of the data symbols;
- determining a total energy of a subset of the substantially single-frequency code components including the first one of the substantially single-frequency code components; and
- calculating the first characteristic as a signal to noise ratio as the ratio between the first energy and the total energy.

15. A decoder as defined in claim 9, wherein the fourth decoder circuit is to detect the presence of the first one of the data symbols from the accumulated streams of symbol values by comparing the first one of the accumulated streams of symbol values to a first set of characteristics that are representative of a synchronization symbol, the synchronization symbol being one of the data symbols.

16. A decoder as defined in claim 15, wherein the fourth decoder circuit is to detect the presence of the second one of the data symbols from the accumulated streams of symbol values by comparing the second one of the accumulated streams of symbol values to a second set of characteristics that are representative of a second one of the data symbols, the fourth decoder circuit further to:
  detect a presence of a third one of the data symbols from the accumulated streams of symbol values based on a second set of audio signal samples occurring after the first set of audio signal samples;
  detect a presence of a fourth one of the data symbols from the accumulated streams of symbol values based on the second set of audio signal samples;
  determine a first offset between a value of the synchronization symbol and a value of the second one of the data symbols;
  determine a second offset between a value of the third one of the data symbols and a fourth one of the data symbols; and
  when the first offset is not equal to the second offset, performing error correction on at least one of the first, second, third, or fourth ones of the data symbols.

17. An article of manufacture comprising computer readable instructions which, when executed, cause a processor to at least:
  collect an encoded audio signal containing multiple synchronized layers of data symbols;
  convert a first set of audio samples in the encoded audio signal to a first frequency domain representation that includes substantially single-frequency code components having corresponding frequency component values;
  generate, based on characteristics of the frequency component values, streams of symbol values corresponding to a set of the data symbols that may have been encoded in the encoded audio signal, the data symbols corresponding to respective subsets of the substantially single-frequency code components;
  accumulate the streams of the symbol values; and
  detect a presence of a first one of the data symbols from the accumulated streams of symbol values in a first one of the synchronized layers by matching a first one of the accumulated streams of symbol values to a first one of the subsets of the substantially single frequency code components;
  detect a presence of a second one of the data symbols from the accumulated streams of symbols values in a second one of the synchronized layers by matching a second one of the accumulated streams of symbols values to a second one of the subsets of the substantially single-frequency code components; and
  determine message contents of the synchronized layers in the encoded audio signal based on the presence of the first one of the data symbols in the first one of the synchronized layers and based on the presence of the second one of the data symbols in the second one of the synchronized layers.

18. An article of manufacture as defined in claim 17, wherein the data symbols respectively correspond to different ones of multiple non-overlapping subsets of the substantially single-frequency code components, and the instructions are further to cause the processor to detect the presence of the first one of the data symbols by comparing signal to noise ratio values of a first one of the non-overlapping subsets of the substantially single-frequency code components to a threshold.

19. An article of manufacture as defined in claim 17, wherein the instructions are to cause the processor to generate the streams of symbol values by:
  calculating first characteristic values from the frequency component values for respective ones of the substantially single-frequency code components in a first one of the sets of the substantially single-frequency code components that corresponds to a first one of the data symbols; and
  calculating second characteristic values from the frequency component values for respective ones of the substantially single-frequency code components in a second one of the sets of the substantially single-frequency code components that corresponds to a second one of the data symbols.

20. An article of manufacture as defined in claim 19, wherein the instructions are further to cause the processor to convert a second set of audio signal samples in the encoded audio signal to a second frequency domain representation that includes second frequency component values corresponding to the substantially single-frequency code components, and the instructions are to cause the processor to generate of the streams of symbol values by:
  calculating third characteristic values from the second frequency component values for respective ones of the substantially single-frequency code components in the first one of the sets of the substantially single-frequency code components; and
  calculating fourth characteristic values from the second frequency component values for respective ones of the substantially single-frequency code components in the second one of the sets of the substantially single-frequency code components.

21. An article of manufacture as defined in claim 20, wherein the instructions are to cause the processor to accumulate the streams of symbol values by adding the first characteristic values and the third characteristic values to generate a first one of the accumulated streams of symbol values, and adding the second characteristic values to the fourth characteristic values to generate a second one of the accumulated streams of symbol values.

22. An article of manufacture as defined in claim 19, wherein the instructions are to cause the processor to calculate the first characteristic values by:
  determining a first energy of a first one of the substantially single-frequency code components that corresponds to the first one of the data symbols;
  determining a total energy of a subset of the substantially single-frequency code components including the first one of the substantially single-frequency code components; and
  calculating the first characteristic as a signal to noise ratio as the ratio between the first energy and the total energy.

23. An article of manufacture as defined in claim 17, wherein the instructions are to cause the processor to detect the presence of the first one of the data symbols from the accumulated streams of symbol values by comparing the first one of the accumulated streams of symbol values to a first set of characteristics that are representative of a synchronization symbol, the synchronization symbol being one of the data symbols.

24. An article of manufacture as defined in claim 23, wherein the instructions are to cause the processor to detect the presence of the second one of the data symbols from the accumulated streams of symbol values by comparing the second one of the accumulated streams of symbol values to a second set of characteristics that are representative of a second one of the data symbols, and the instructions are further to cause the processor to:

detect a presence of a third one of the data symbols from the accumulated streams of symbol values based on a second set of audio signal samples occurring after the first set of audio signal samples;

detect a presence of a fourth one of the data symbols from the accumulated streams of symbol values based on the second set of audio signal samples;

determine a first offset between a value of the synchronization symbol and a value of the second one of the data symbols;

determine a second offset between a value of the third one of the data symbols and a fourth one of the data symbols; and when the first offset is not equal to the second offset, performing error correction on at least one of the first, second, third, or fourth ones of the data symbols.

* * * * *